(12) United States Patent
Yajima et al.

(10) Patent No.: US 11,476,306 B2
(45) Date of Patent: Oct. 18, 2022

(54) SEMICONDUCTOR APPARATUS, PHOTODETECTION SYSTEM, LIGHT EMITTING SYSTEM, AND MOVING BODY

(71) Applicant: CANON KABUSHIKI KAISHA, Tokyo (JP)

(72) Inventors: Takahiro Yajima, Odawara (JP); Takayuki Sumida, Kawasaki (JP); Akira Shimazu, Hiratsuka (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 16/825,973

(22) Filed: Mar. 20, 2020

(65) Prior Publication Data
US 2020/0312913 A1    Oct. 1, 2020

(30) Foreign Application Priority Data

Mar. 27, 2019 (JP) .............................. JP2019-061556

(51) Int. Cl.
*H01L 27/28* (2006.01)
*H01L 27/32* (2006.01)
*H01L 27/30* (2006.01)
*H01L 51/44* (2006.01)

(52) U.S. Cl.
CPC .......... *H01L 27/288* (2013.01); *H01L 27/307* (2013.01); *H01L 27/3244* (2013.01); *H01L 51/442* (2013.01)

(58) Field of Classification Search
CPC . H01L 27/288; H01L 51/442; H01L 27/3244; H01L 27/307; Y02E 10/549

USPC .......................................................... 257/40
See application file for complete search history.

(56) References Cited

U.S. PATENT DOCUMENTS

| 5,196,702 | A | * | 3/1993 | Tsuji | ........................ | H04N 5/32 |
| | | | | | | 250/591 |
| 2008/0289682 | A1 | * | 11/2008 | Adriani | ............. | B32B 17/10018 |
| | | | | | | 136/251 |
| 2016/0043144 | A1 | * | 2/2016 | Sato | ........................ | H04N 5/335 |
| | | | | | | 438/59 |
| 2017/0053624 | A1 | * | 2/2017 | Hayashi | ................. | G09G 5/391 |

(Continued)

FOREIGN PATENT DOCUMENTS

| JP | 2006-260950 A | 9/2006 |
| JP | 2012-064822 A | 3/2012 |

(Continued)

*Primary Examiner* — Duy T Nguyen
(74) *Attorney, Agent, or Firm* — Canon U.S.A., Inc. IP Division

(57) ABSTRACT

A semiconductor apparatus includes, a substrate having a main surface, an upper electrode disposed above the substrate, a first lower electrode and a second lower electrode disposed between the substrate and the upper electrode, an isolation region disposed between the first lower electrode and the second lower electrode, a functional layer configured to perform light emission or photoelectric conversion, and an interface layer disposed at least on the first lower electrode. The semiconductor apparatus further includes a first insulator portion that is disposed between the first lower electrode and the second lower electrode and includes a first portion disposed at a position farther away from the main surface than an upper surface of the interface layer.

49 Claims, 11 Drawing Sheets

(56) References Cited

U.S. PATENT DOCUMENTS

2018/0109706 A1* 4/2018 Matsuda ............. H01L 27/1461
2018/0213170 A1* 7/2018 Segawa ................ H04N 13/239

FOREIGN PATENT DOCUMENTS

| JP | 2016-033978 A | 3/2016 |
| JP | 2017-017200 A | 1/2017 |

* cited by examiner

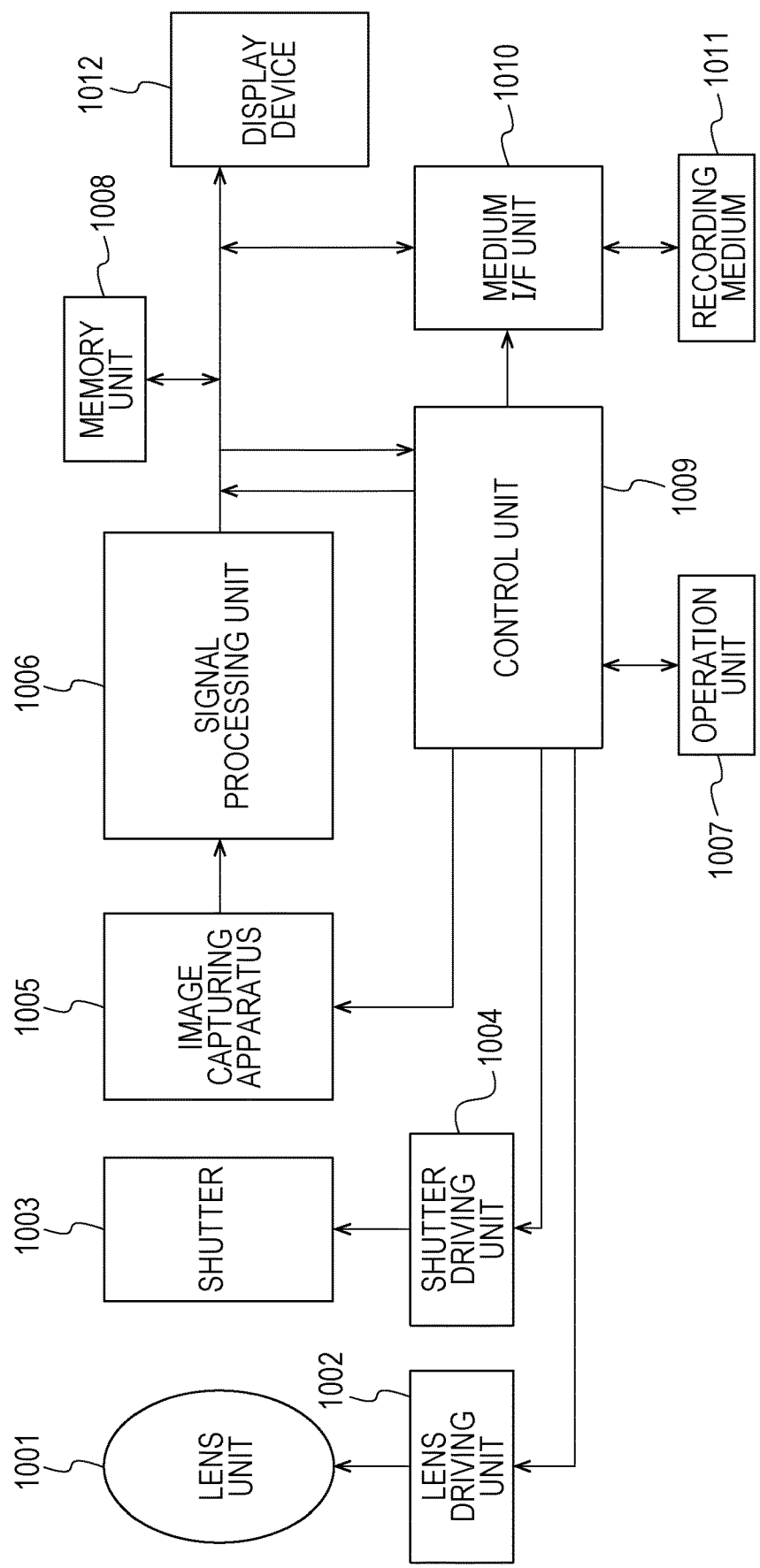

SEMICONDUCTOR APPARATUS, PHOTODETECTION SYSTEM, LIGHT EMITTING SYSTEM, AND MOVING BODY

BACKGROUND OF THE INVENTION

Field of the Invention

The present disclosure relates to a semiconductor apparatus, a photodetection system, a light emitting system, and a moving body.

Description of the Related Art

A photoelectric conversion apparatus is known in which pixels each having two electrodes and a photoelectric conversion layer as a photoelectric conversion unit are disposed. The photoelectric conversion apparatus of Japanese Patent Laid-Open No. 2016-033978 discloses a configuration in which a photoelectric conversion layer covers an insulating member disposed on one electrode.

SUMMARY OF THE INVENTION

An aspect of the present disclosure includes: a first unit cell and a second unit cell disposed on a substrate having a main surface, the first unit cell and the second unit cell each including an upper electrode disposed above the substrate, a first lower electrode disposed between the substrate and the upper electrode, a second lower electrode disposed between the substrate and the upper electrode, an isolation region disposed between the first lower electrode and the second lower electrode, a functional layer disposed between the first lower electrode and the upper electrode and between the second lower electrode and the upper electrode, the functional layer being configured to perform light emission or photoelectric conversion, and an interface layer having a portion disposed between the first lower electrode and the functional layer, and a portion disposed between the second lower electrode and the functional layer, the functional layer of the first unit cell and the functional layer of the second unit cell being disposed in common; and a first insulator portion that is disposed between the first lower electrode and the second lower electrode and includes a first portion disposed at a position farther away from the main surface than an upper surface of the portion disposed between the first lower electrode of the interface layer and the functional layer.

Another aspect of the present disclosure includes, a substrate having a main surface; an upper electrode disposed above the substrate, a first lower electrode disposed between the substrate and the upper electrode, a second lower electrode disposed between the substrate and the upper electrode, an isolation region disposed between the first lower electrode and the second lower electrode, a functional layer disposed in succession between the first lower electrode and the upper electrode and between the second lower electrode and the upper electrode, the functional layer being configured to perform light emission or photoelectric conversion; an interface layer disposed at least between an upper surface of the first lower electrode and the functional layer; and a first insulator portion, in which the interface layer is located between the first lower electrode and the first insulator portion.

Further features of the present disclosure will become apparent from the following description of exemplary embodiments (with reference to the attached drawings).

BRIEF DESCRIPTION OF THE DRAWINGS

FIG. 10 is a block diagram showing an example of electronic equipment.

DESCRIPTION OF THE EMBODIMENTS

Figure 1:
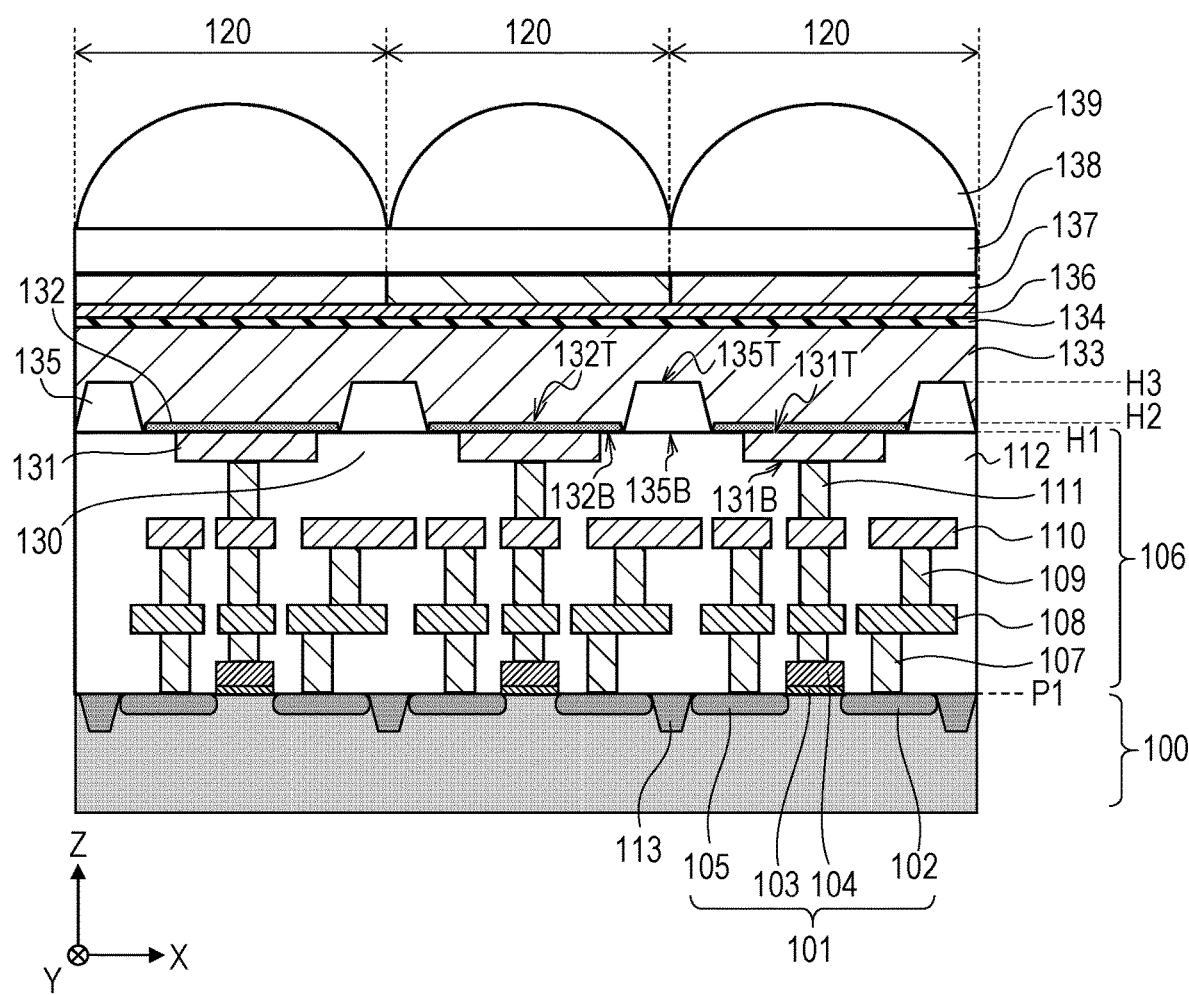
FIG. 1 is a schematic cross-sectional view showing a semiconductor apparatus in the first embodiment.

Hereinafter, a semiconductor apparatus according to embodiments will be described with reference to the drawings. Each of the embodiments exemplifies the present disclosure. Therefore, numerical values, shapes, materials, components, arrangement and connection of components, etc. are not intended to limit the present disclosure. For example, although a photoelectric conversion apparatus is used as a semiconductor apparatus in each of the embodiments, it is also applicable to a light emitting device. Furthermore, although descriptions will be given of transistors and semiconductor regions in each of the embodiments, its conductive type is changeable appropriately.

Configurations to which the same reference numerals are given in each of the drawings are referred to as the equivalent configuration, and thus, the descriptions therefor will be omitted. Furthermore, for those that can be understood as

First Embodiment

A semiconductor apparatus of the present embodiment is a photoelectric conversion apparatus. FIG. 1 is a schematic cross-sectional view showing three unit cells 120 of the photoelectric conversion apparatus. Here, FIG. 1 is a cross-section in a plane including the Z direction which is the upper direction and the X direction. The unit cells 120 are also referred to as a pixel or a sub-pixel. Each of the unit cells 120 has an equivalent circuit configuration. Here, in a case where the semiconductor apparatus is a photoelectric conversion apparatus, the unit cell 120 has at least one photoelectric conversion element. In a case where the semiconductor apparatus is a light emitting device, the unit cell 120 has at least one light emitting element. The photoelectric conversion element and the light emitting element are configured by appropriately selecting a material of a functional layer to be described later. Furthermore, the circuit configuration of the unit cell of the photoelectric conversion apparatus or the light emitting device is appropriately set. Next, a detailed description will be given of the photoelectric conversion apparatus of FIG. 1.

In FIG. 1, a substrate 100 has a main surface P1. The material of the substrate 100 may be glass or ceramic. In the present embodiment, the substrate 100 is a semiconductor substrate made of silicon single crystal. The substrate 100 includes a transistor 101 and an element isolation portion 113. The transistor 101 includes a source drain region 102, a gate insulating film 103, a gate electrode 104, and a source drain region 105. The gate electrode 104 is disposed on the main surface P1. The gate insulating film 103 is located between the gate electrode 104 and the main surface P1. The source drain region 102 and source drain region 105 are disposed within the substrate 100.

On the main surface P1 of the substrate 100, a wiring structure 106 is provided. The wiring structure 106 includes a contact plug 107, a wiring layer 108, a via plug 109, a wiring layer 110, a via plug 111, and an insulating film 112. Although not shown in detail in FIG. 1, the insulating film 112 may be a multilayer film. For these members, common semiconductor materials may be used.

Above the substrate 100, an upper electrode 134 is disposed. In the present embodiment, the upper electrode 134 is provided continuously over the three unit cells 120. In other words, the upper electrode of at least the first unit cell from the left and the upper electrode of the second unit cell from the left are provided in common. The one upper electrode is provided for at least two unit cells. And the upper electrodes belonging to at least two unit cells are a physically integral structure. Furthermore, the upper surface and the lower surface of the upper electrode 134 are flat. Since they are flat, the optical characteristics are improved. Furthermore, it can be recognized that a lower electrode 131 is included in the wiring structure 106. The lower electrode 131 is disposed between the substrate 100 and the upper electrode 134. At least one lower electrode 131 is included in each of the unit cells 120. In the present embodiment, a configuration is shown in which one lower electrode 131 is provided for each of the unit cells 120. Between the plurality of lower electrodes 131, an isolation region 130 is disposed. The isolation region 130 may be an insulating film 112 of the wiring structure 106. A functional layer 133 is disposed between the respective lower electrodes 131 and the upper electrode 134. The functional layer of at least the first unit cell from the left and the functional layer of the second unit cell from the left are provided in common. In other words, the one functional layer is provided for at least two unit cells. And the functional layers belonging to at least two unit cells are a physically integral structure. The functional layer 133 performs light emission or photoelectric conversion. In a case where the functional layer 133 performs light emission, the lower electrode 131 may provide control signals for controlling the emission and non-emission and the emission intensity to the functional layer 133. In a case where the functional layer 133 performs photoelectric conversion, the lower electrode 131 may read signals based on the charge generated by the photoelectric conversion. In the present embodiment, the functional layer 133 will be described as performing photoelectric conversion. Between the functional layer 133 and the plurality of lower electrodes 131, an interface layer 132 is disposed. In FIG. 1, three interface layers separated from each other are shown. Here, it can be recognized that the interface layer 132 has, for example, a portion disposed between the functional layer 133 and one lower electrode 131 and a portion disposed between the functional layer 133 and another lower electrode 131 different from the one lower electrode 131. The interface layer 132 is a layer for ensuring electrical isolation with respect to some carriers between the lower electrode 131 and the functional layer 133. Furthermore, the interface layer 132 is a layer for ensuring conduction with respect to another carrier between the lower electrode 131 and the functional layer 133. It can be recognized that the interface layer 132 is a carrier injection blocking layer. Furthermore, the interface layer 132 can also serve as an adhesion layer, and it is possible to suppress film peeling from occurring due to the wettability between the lower electrode 131 and the functional layer 133 being poor. For the portion without the interface layer 132, an insulator portion 135 may be formed on an interface of the lower electrode 131 and the functional layer 133, or the isolation region 130 and the functional layer 133. In the interface layer 132, a layer for conducting only holes by blocking electrons (electron block interface layer) can be applied to the electrode for collecting holes (positive electrode), and a layer for conducting only electrons by blocking holes (hole block interface layer) can be applied to the electrode for collecting electrons (negative electrode).

In FIG. 1, above the upper electrode 134, an insulating layer 136, a color filter layer 137, a planarizing layer 138, and a microlens layer 139 are arranged in this order along the Z direction. The insulating layer 136 may serve as a protective layer or a sealing layer. The color filter layer 137 includes a color filter corresponding to a plurality of colors. For example, one unit cell 120 includes one color filter. The planarizing layer 138 is disposed over the color filter layer 137 and has a flat top surface. The microlens layer 139 has a plurality of microlenses. For example, one unit cell 120 includes one microlens.

The semiconductor apparatus of the present embodiment includes the insulator portion 135 disposed between the two lower electrodes 131. The insulator portion 135 will be described with reference to FIGS. 1 and 2A. Here, in the present embodiment, the insulator portion 135 is a cavity, and, for example, it is assumed that air or insulating gas is contained in the insulator portion 135.

Figure 2A:
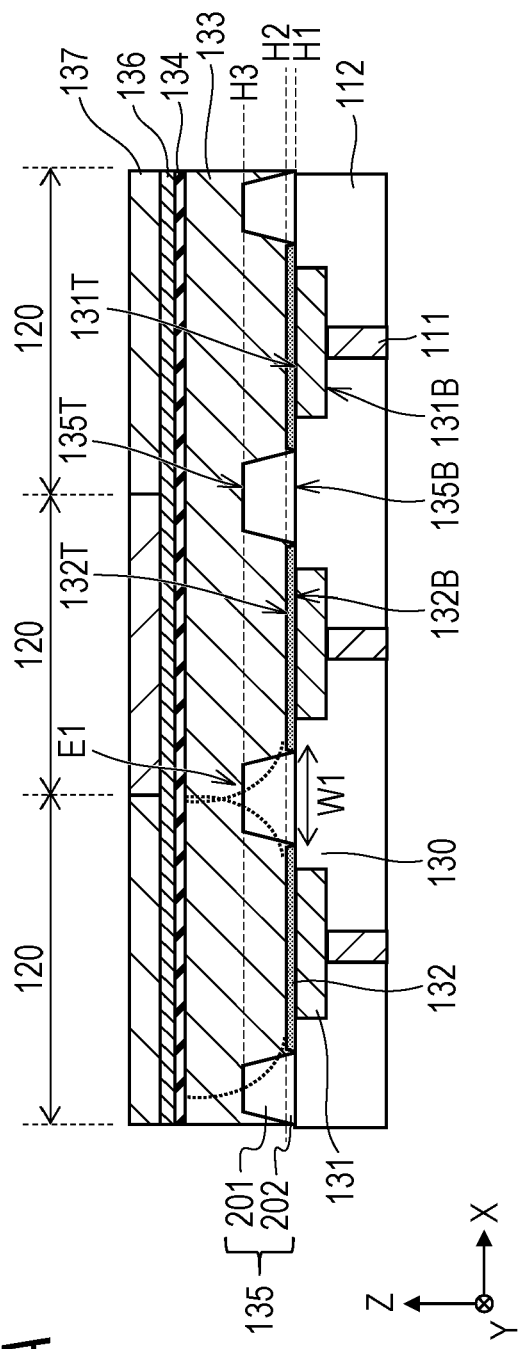
FIG. 2A is a schematic cross-sectional view showing a semiconductor apparatus in the first embodiment.

FIG. 2A is a cross-sectional view enlarging from a portion of the wiring structure 106 of FIG. 1 to the color filter layer 137. The insulator portion 135 has a portion 201 disposed at a position farther away from the main surface P1 than the upper surface of the interface layer 132 disposed on the lower electrode 131. Furthermore, the insulator portion 135 has a portion 201 surrounded by the functional layer 133 in a cross-sectional view perpendicular to the main surface P1. Here, a description will be given of the positional relationship among the insulator portion 135, the interface layer 132, and the lower electrode 131. The height H1, the height H2, and the height H3 are taken along the Z direction from the main surface P1. At this time, the height H1 includes an upper surface 131T of the lower electrode 131, a lower surface 132B of the interface layer 132, and a lower surface 135B of the insulator portion 135. The height H2 includes an upper surface 132T of the interface layer 132. The height H3 includes an upper surface 135T of the insulator portion 135. Here, the portion 201 included in the insulator portion 135 is disposed at a position farther away from the main surface P1 than the upper surface 132T of the interface layer 132. That is, the portion 201 is located between the height H2 and the height H3. Such an insulator portion 135 makes it possible to alleviate the electric field strength in the direction of the adjacent unit cell 120 in a state where a voltage is applied between the upper electrode 134 and the lower electrode 131. This is because the electric field E1 indicated by the dotted line in FIG. 2A is weakened by the portion 201. Therefore, it is possible to selectively and effectively collect only the carriers generated above the lower electrode 131.

Furthermore, the insulator portion 135 has a portion 202. The portion 202 is located closer to the main surface P1 than the upper surface 132T of the interface layer 132. The portion 202 is also located between the height H1 and the height H2. In a cross section perpendicular to the main surface P1, the portion 202 is located between the two interface layers 132 along a direction parallel to the main surface P1 (for example, the X direction). The interface layer 132 of the adjacent lower electrode 131 is separated by the insulator portion 135, and thus not continuous. With such a configuration, even when the electrical conductivity of the interface layer 132 is high, it is possible to reduce mixing of the carriers of the adjacent unit cells 120 through the interface layer 132. In the film thickness direction, i.e. the Z direction in FIG. 2A, of the interface layer 132, the carrier injection can be blocked, and, in the horizontal direction of the interface layer 132, i.e. the X direction in FIG. 2A, when the electrical conductivity of the interface layer 132 is high, the carriers can move freely. That is, when the electrical conductivity of the interface layer 132 is high, leakage current between unit cells or crosstalk between unit cells may occur.

In the present embodiment, it can also be recognized that a portion of the functional layer 133 is surrounded by the insulator portion 135 in a plan view in a plane parallel to the main surface P1. The portion of the functional layer 133 is a portion that is above the lower electrode 131 and located between the height H2 and the height H3. Such a configuration makes it possible to reduce crosstalk between the unit cell 120 and the unit cell 120 adjacent thereto.

Furthermore, in FIG. 2A, the functional layer 133 is provided continuously over the plurality of unit cells 120 at any height between the height H3 and the upper electrode 134. Such a configuration makes it possible to form the upper electrode 134 flat, and to improve the optical characteristics. It is possible to reduce the crosstalk while improving the optical characteristics in a case where the functional layer 133 is provided in common to the plurality of unit cells 120 as shown in FIG. 2A.

Furthermore, as a material of the functional layer 133 and the insulator portion 135, if selecting a material that causes the difference in their refractive indices to increase, the light reaching the side surface of the insulator portion 135 can be reflected by the insulator portion 135 and condensed on the lower electrode 131. That is, by selecting the material of the insulator portion 135 and the functional layer 133, the functional layer 133 surrounded by the insulator portion 135 may serve as a light guide section.

Figure 7A:
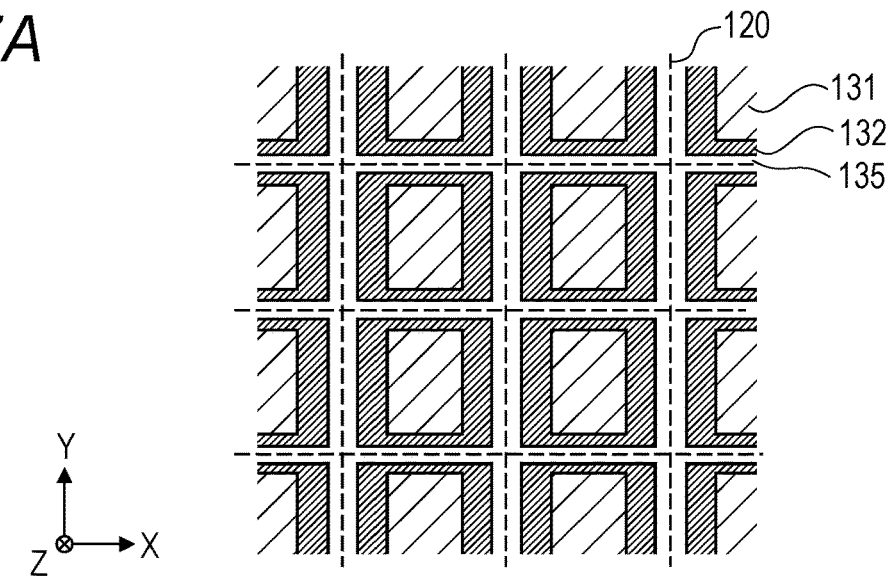
FIG. 7A is a schematic plan view showing a semiconductor apparatus in the first embodiment.

FIG. 7A is a schematic plan view showing a planar positional relationship among the lower electrode 131, the interface layer 132, and the insulator portion 135. The lower electrode 131 and the interface layer 132 each have a rectangular shape, the interface layer 132 is larger than the lower electrode 131, and the lower electrode 131 is enclosed by the outer edge of the interface layer 132. The insulator portion 135 is disposed at the boundary portion of the unit cell 120. In a case where the unit cell 120 is disposed two-dimensionally, the insulator portion 135 is in a lattice shape and surrounds each of the lower electrodes 131. It should be noted that the outer edge of the lower electrode 131 and the outer edge of the insulator portion 135 may be located in the same position. In the present embodiment, taking into account the variation during manufacture of the lower electrode 131 and the insulator portion 135, the outer edge of the insulator portion 135 is located at a position separated from the outer edge of the lower electrode 131. The separated distance can be set between 0.01 μm or more and 5.0 μm or less depending on the size of the unit cell 120. In order to reduce the crosstalk, it is preferable to reduce the separated distance, and the distance is preferably 0.01 μm or more and 0.1 μm or less. Furthermore, in a case where the area of the insulator portion 135 increases, since the area of the contact between the functional layer 133 and the interface layer 132 is reduced, there is a possibility that film peeling of the functional layer 133 occurs. It is preferable to set the area ratio of the insulator portion 135 or the functional layer 133 to the area of the unit cell 120 while taking into account the material of the functional layer 133 and the interface layer 132. The size of the insulator portion 135 is between 0.1 nm and 20 μm inclusive. The insulator portion 135 may be thinner than the functional layer 133. In a case where the functional layer 133 is composed of a quantum dot, the size of the insulator portion 135 may be as large as the nanoparticles (the average particle size is 0.5 nm or more and less than 100 nm). Furthermore, as shown in FIG. 7A, the insulator portion 135 is shown as one region in the lattice and has a continuous shape; however, it may be partially cut and present intermittently.

Figure 2B:
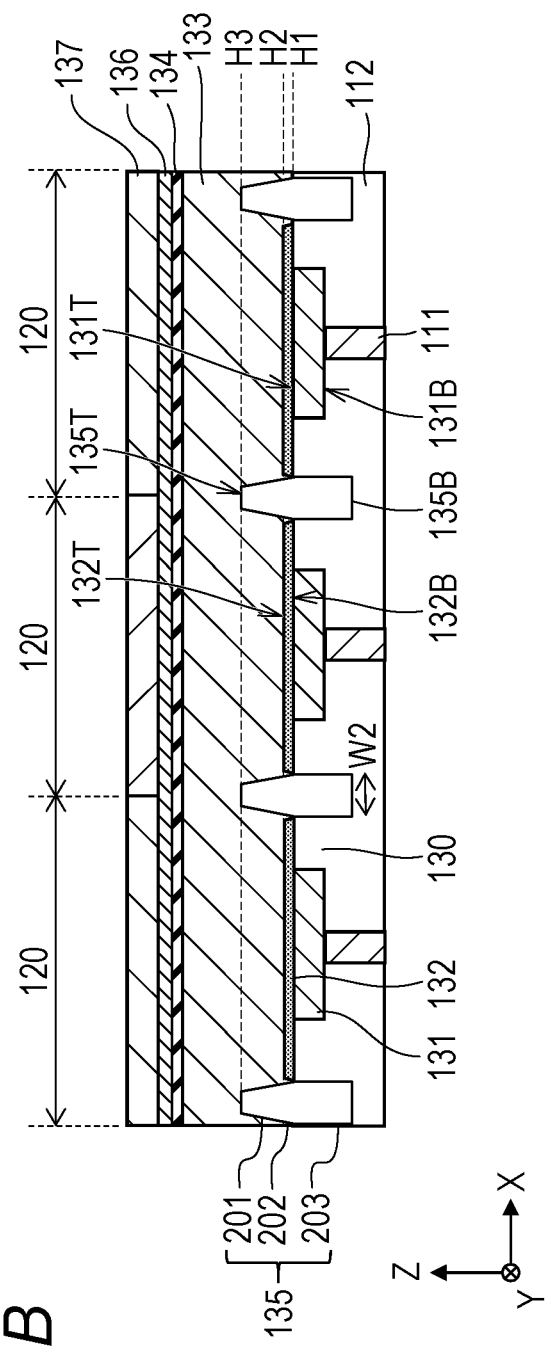
FIG. 2B is a schematic cross-sectional view showing a modification example of the semiconductor apparatus in the first embodiment.

FIG. 2B is a schematic cross-sectional view showing a modification example of the semiconductor apparatus of the present embodiment. FIG. 2B is different in that the width of the insulator portion 135 is narrowed, and the insulator portion 135 includes a portion 203. First, in FIG. 2A, the insulator portion 135 has a width W1. However, in FIG. 2B, the insulator portion 135 has a width W2 which is smaller than the width W1. Here, it is assumed that the width W1 and the width W2 are the maximum widths of the respective insulator portions 135. If the width of the insulator portion 135 is narrow, the area of the functional layer 133 is increased. Therefore, it is possible to improve the sensitivity. Next, the portion 203 of the insulator portion 135 is located closer to the main surface P1 than the height H1, and is located between the height H1 and the main surface P1. Including the portion 203 allows for electrical separation between the unit cells 120. It should be noted that the depth of the portion 203 from the height H1 can be appropriately changed.

Material of the Semiconductor Apparatus of the First Embodiment

Materials for the semiconductor apparatus of the first embodiment will be described. First, a description will be given of the functional layer 133. The functional layer 133 in the present embodiment is a photoelectric conversion film. The material may be an inorganic material or an organic material. For example, for the photoelectric conversion film, amorphous silicon, a quantum dot which is an aggregate of nanoparticles of an organic semiconductor or a compound semiconductor material, or the like can be used. As the organic semiconductor, for example, fullerene (C60), coumarin 6 (C6), rhodamine 6G (R6G), quinacridone, phthalocyanine-based, naphthalocyanine-based, and the like are preferred. In the present embodiment, a quantum dot which is an aggregate of nanoparticles of a compound semiconductor material will be described as an example.

The quantum dot constituting the functional layer 133 is composed of nanoparticles (the average particle size is 0.5 nm or more and less than 100 nm). The materials of the nanoparticles are, for example, a group IV semiconductor, a group III-V or group II-VI compound semiconductor, or a compound semiconductor including three or more combinations of group II, group III, group IV, group V, and group VI elements, which are common semiconductor crystals. More specifically, the semiconductor materials having a relatively narrow band gap semiconductor materials such as PbS, PbSe, PbTe, InN, InAs, InP, InSb, InAs, InGaAs, CdS, CdSe, CdTe, Ge, CuInS, CuInSe, CuInGaSe, Si, and the like are exemplified. They are also referred to as semiconductor quantum dots. As a quantum dot, it is sufficient to include at least one of these semiconductor quantum dot materials. The quantum dot may be a core shell structure in which a semiconductor quantum dot material as a core is coated with a coating compound. Among the materials described above, the semiconductor quantum dot material is desirably PbS or PbSe owing to ease of synthesizing the quantum dot. The average particle size of the quantum dot is desirably between 2 nm and 15 nm inclusive. For the measurement of the particle size of the quantum dot, a transmission electron microscope is used. In a case where the average particle size of the quantum dot is 15 nm or less, it is possible to control the band gap owing to the quantum size effect. By the average particle size of the quantum dot being 2 nm or more, it is possible to easily control the crystal growth of the quantum dot in the synthesis of the quantum dot. The method of manufacturing the functional layer 133 which is composed of an aggregate of nanoparticles as a quantum dot is not particularly limited. Although the film thickness of the functional layer 133 is not particularly limited, from the viewpoint of obtaining a high electrical conductivity, it is preferably 10 nm or more, and more preferably 50 nm or more. Furthermore, from the viewpoint of ease of manufacturing, the film thickness of the functional layer 133 is preferably 800 nm or less.

Next, a description will be given of the material of the interface layer 132. In the present embodiment, the interface layer 132 is also effective for suppressing the film peeling of the functional layer 133 which occurs due to poor wettability of the lower electrode 131 and the functional layer 133, or the isolation region 130 and the functional layer 133. For the portion without the interface layer 132, the insulator portion 135 may be disposed on each interface of the lower electrode 131 and the functional layer 133, or the isolation region 130 and the functional layer 133. Examples of the types of the interface layer 132 include a layer that conducts only holes by blocking electrons (electron block interface layer) and a layer that conducts only electrons by blocking holes (hole block interface layer). For example, the electron block interface layer can be provided for the electrode (positive electrode) for collecting holes, and the hole block interface layer can be provided for the electrode (negative electrode) for collecting electrons. Hereinafter, a description will be given of the functional layer 133 as a photoelectric conversion layer that performs photoelectric conversion.

A description will be given of a case of the electron block interface layer. As a material of the electron block interface layer, it is preferable that the material can efficiently transport holes generated in the photoelectric conversion layer to the positive electrode. The material preferably has such properties as high hole mobility, high electrical conductivity, small hole injection barrier with respect to positive electrodes, and small hole injection barrier from a photoelectric conversion layer to an electron block interface layer. Furthermore, in a case of taking light into the photoelectric conversion layer through the electron block interface layer, it is preferable to use a highly transparent material as a material of the electron block interface layer. In a case of taking visible light into the photoelectric conversion layer, as a material of a transparent electron block interface layer, the material having the transmittance of visible light transmitted of normally 60% or more, and 80% among others is preferably used. From such a viewpoint, examples of the materials of the electron block interface layer include a P-type semiconductor material such as an inorganic semiconductor such as molybdenum oxide $MoO_3$, nickel oxide $NiO_2$, or the like. On the other hand, the function required for the hole block interface layer is to block holes isolated from the photoelectric conversion layer and transport electrons to the negative electrode. Therefore, in the description of the hole block interface layer, the positive electrode is replaced with the negative electrode, the P-type semiconductor is replaced with the N-type semiconductor, and the holes are replaced with the electrons. Furthermore, the configuration of emitting light from the negative electrode side is considered, or it is considered to effectively utilize the light reflected from the negative electrode side, and in such a case, the transmittance is also required to be high. From such a viewpoint, preferred examples of the material of the hole block interface layer include an N-type semiconductor material such as an inorganic semiconductor such as titanium oxide $TiO_2$ and zinc oxide ZnO, and an N-type semiconductor material such as fullerene C60.

The interface layer 132 is formed to have the film thickness of about 1 nm to about 100 nm. In the interface layer 132, the injection of electric charges can be controlled by applying an electric field with respect to the film thickness direction, and it is possible that the electric charges can move freely in the horizontal direction with respect to the film thickness. In a case where the electrical conductivity as a film of the interface layer 132 is high, leakage current or crosstalk between the unit cells may be caused.

Next, a description will be given of the material of the lower electrode 131 and the upper electrode 134. The lower electrode 131 and the upper electrode 134 can be formed of any conductive material as electrodes. Examples of constituent materials of the electrodes include metals such as platinum, gold, silver, aluminum, chromium, nickel, copper, titanium, magnesium, or alloys thereof, metal oxides such as indium oxide or tin oxide, or composite oxides thereof (e.g., ITO and IZO). Furthermore, examples of the constituent materials of the electrodes include conductive particles such as carbon black, fullerene, carbon nanotubes, graphene, or the like, or a conductive composite material such as a polymer binder dispersed in a matrix. As the constituent materials of the electrodes, one kind thereof may be used alone, or alternatively, any two or more kinds thereof may be combined at any ratio. In the photoelectric conversion apparatus or the light emitting device, at least a pair (two) of electrodes are provided, and the functional layer 133 is provided between the pair of electrodes. At this time, at least one of the pair of electrodes is transparent. This is because it transmits light absorbed by the functional layer 133 or transmits light emitted by the functional layer 133. The electrodes each have a function of collecting electrons and holes generated inside the functional layer 133. Therefore, as the constituent materials of the electrodes, among the materials described above, it is preferable to use a constituent material suitable for collecting electrons and holes. Examples of the electrode materials suitable for collecting holes include materials having a high work function such as Au, ITO, and the like. On the other hand, the electrode materials suitable for collecting electrons include materials having a low work function such as A1. The thickness of the electrodes is not particularly limited, and is appropriately determined by taking into account the materials used, the required conductivity, transparency, etc. However, the thickness thereof is normally about 10 nm to about 10 μm.

A description will be given of the material of the insulator portion 135. The insulator portion 135 is composed of a material that maintains electrical insulation. Furthermore, the material of the insulator portion 135 is preferably a material having a lower density than the surrounding material, so as to lower the optical refractive index. By using a material having a low refractive index, the insulator portion 135 can serve as a wall of the light guide section. It is preferable that the insulator portion 135 includes an insulating gas or air. However, the insulator portion 135 in which the functional layer is vaporized may also be preferable. For example, the insulator portion 135 may also include one in which nanoparticles are vaporized, or solvents having nanoparticles dispersed therein is vaporized. Furthermore, the insulator portion 135 may also be a vacuum, or alternatively, it may be filled with a gas such as nitrogen, water vapor, helium, neon, argon, krypton, xenon, radon, etc. Alternatively, the insulator portion 135 may also be filled with a liquid, an electrolytic liquid, or an ionic liquid having an insulating property such as an organic solvent. Furthermore, the insulator portion 135 may be a mixture thereof.

Method of Manufacturing a Semiconductor Apparatus of the First Embodiment

Figure 8A:
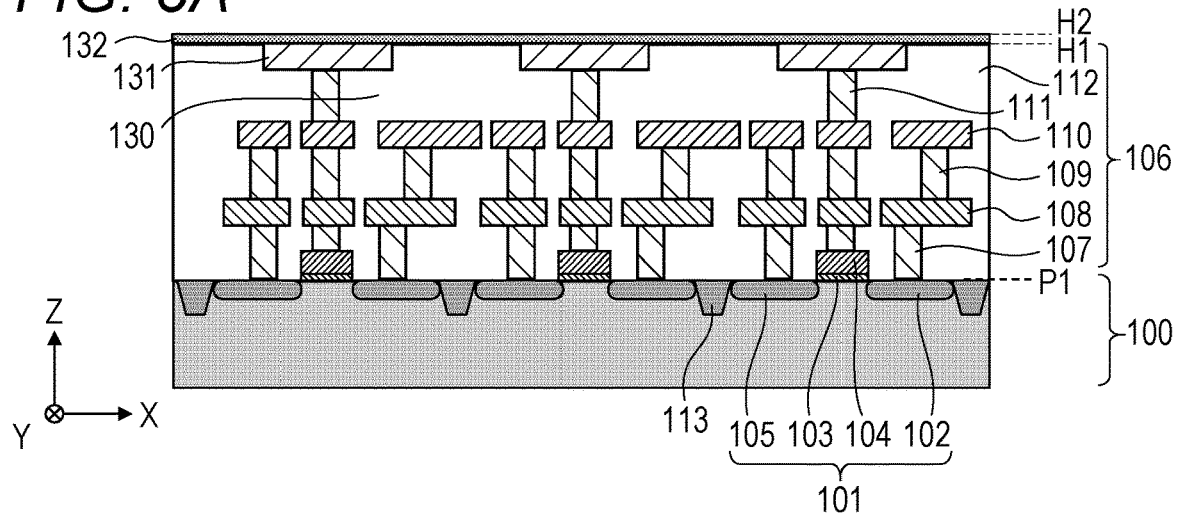
FIG. 8A-8C is a schematic cross-sectional view showing a method of manufacturing a semiconductor apparatus in the first embodiment.
Figure 8B:
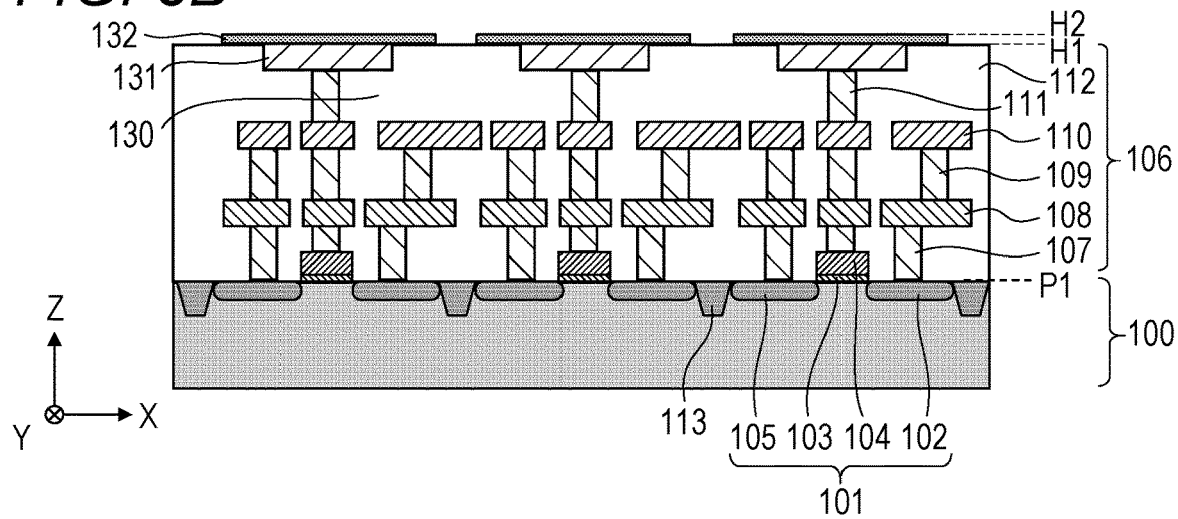
Figure 8C:
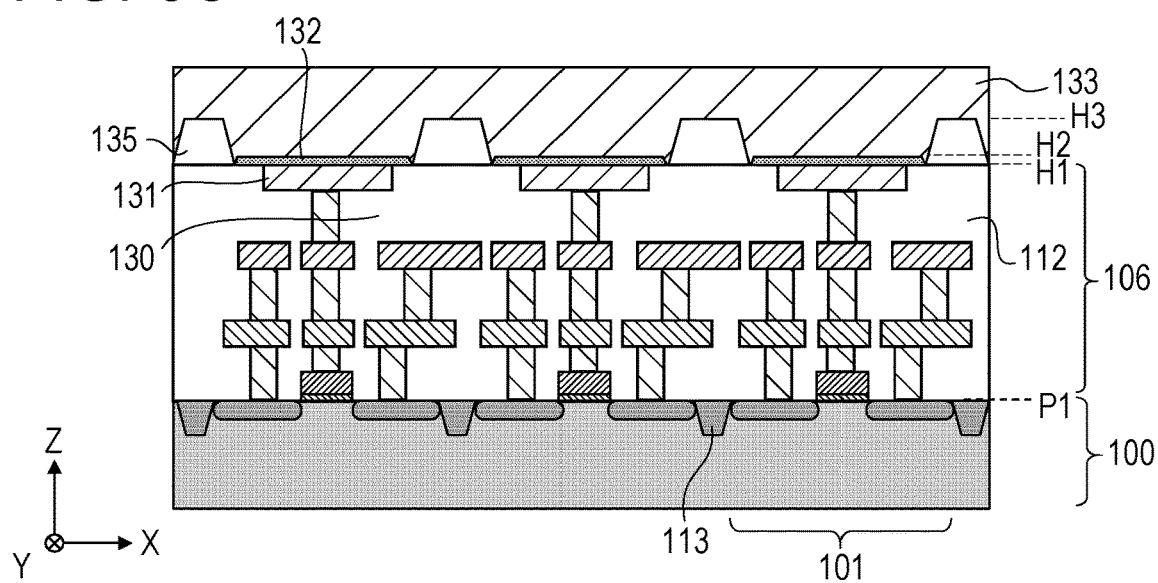

A description will be given of a method of manufacturing a semiconductor apparatus of the first embodiment. FIGS. 8A to 8C are each a schematic cross-sectional view showing a method of manufacturing a semiconductor apparatus. In FIGS. 8A to 8C, there is a case where the same reference numeral is given to the member before processing as well as the member after processing of FIG. 1.

A description will be given of the processing shown in FIG. 8A. First, the substrate 100 on which the wiring structure 106 is formed is prepared. Thereafter, a film serving as the interface layer 132 is formed on the wiring structure 106. First, a description will be given of the step of preparing the substrate 100 on which the wiring structure 106 is formed. The element isolation portion 113 and the transistor 101 are formed on the substrate 100 which is a semiconductor substrate. The element isolation portion 113 has an STI structure (Shallow Trench Isolation), for example. The transistor 101 is, for example, an N-type MOS transistor, and includes the gate electrode 104, the gate insulating film 103, the source drain region 102, and the source drain region 105. The source drain regions 102 and 105 each include an N-type semiconductor region.

Next, the wiring structure 106 is formed on the substrate 100. The contact plug 107, the via plug 109, and the via plug 111 are composed of a material selected from a metal such as Al, Cu, W, Ti, TiN, or the like, and, in the present embodiment, may have a laminated structure of titanium, titanium nitride, and tungsten. The wiring layer 108 and the wiring layer 110 are composed of a material selected from a metal such as Al, Cu, W, Ti, TiN, or the like, and, in the present embodiment, may have a stacked structure of tantalum and copper. The insulating film 112 is composed of, for example, a film such as silicon oxide and silicon nitride. Next, the lower electrode 131 composed of copper or aluminum is formed on the via plug 111. The lower electrode 131 is formed to have a thickness of about 10 nm to about 500 nm. A configuration of forming the insulating film 112 after forming the lower electrode 131 may be included. At that time, the planarization processing is performed so that the insulating film 112 and the upper surface of the lower electrode 131 coincide with each other at the height H1. The planarization processing is carried out by etching or the CMP (Chemical Mechanical Polishing) method. For these manufacturing methods, general semiconductor processing can be applied.

Thereafter, a film serving as the interface layer 132 is formed on the insulating film 112 and the lower electrode 131. The film serving as the interface layer 132 is composed of the above-described material, and, for example, is formed by a vapor deposition method or a sputtering method. The film serving as the interface layer 132 is deposited so as to have the thickness of about 1 nm to about 100 nm. In a case where the film thickness of the interface layer 132 is thin, the voltage applied to the functional layer 133 can be reduced. However, in a case where the film thickness of the interface layer 132 is thick, it is possible to reduce passing through of the electrons or holes due to the tunneling effect, and it is also possible to avoid film defects such as pinholes. For example, by configuring the film thickness of the interface layer 132 to be thicker than the irregularities of the surface of the lower electrode 131, it is possible to reduce the defects of the interface layer 132. In view of these aspects, the film thickness of the interface layer 132 may be appropriately set. In this way, the configuration of FIG. 8A is completed.

Next, as shown in FIG. 8B, a portion of the interface layer 132 is removed. On the film serving as the interface layer 132, a resist mask is formed by photolithography, and by etching until a portion of the surface of the insulating film 112 is exposed using the resist mask, it is possible to remove the interface layer 132.

Subsequently, as shown in FIG. 8C, the functional layer 133 is formed. Specifically, a quantum dot which is an aggregate of nanoparticles of a compound semiconductor is deposited on the entire surface to form the functional layer 133. The functional layer 133 is formed so as to cover the insulating film 112 and the interface layer 132 configuring the isolation region 130. The functional layer 133 is formed above the lower electrode 131 and the isolation region 130 other than the lower electrode 131. However, in the lower electrode 131 and a portion of the isolation region 130, the functional layer 133 is formed on the interface layer 132. Since the interface layer 132 is removed on the isolation region 130, the functional layer 133 is not partially provided.

For the region without such a functional layer 133, as described above, the insulator portion 135 is formed.

Here, a detailed description will be given of a method of forming the insulator portion 135. As described above, by removing the interface layer 132, it is possible to form the insulator portion 135. For the method of removing the interface layer 132, for example, in a case where the interface layer 132 is formed by using a vapor deposition method or a sputtering method in a structure having a convex portion, it is possible to form a portion having a thin film of the interface layer 132 on the side surface of the convex portion, or a portion at which the interface layer 132 is not deposited. Furthermore, a resist mask is formed by photolithography after forming the interface layer 132, and etching is performed with respect to the interface layer 132 using the resist mask, and thus, it is possible to remove the interface layer 132.

The insulator portion 135 can also be formed by performing heat treatment with respect to the functional layer 133. Furthermore, the insulator portion 135 can also be formed by performing heat treatment when forming the color filter layer 137 rather than with respect to the functional layer 133. This is a method of utilizing deformation during heating of the functional layer 133. For example, in a case where the functional layer 133 is a quantum dot material composed of an aggregate of nanoparticles, the linear expansion coefficient will be about $1 \times 10^{-4}$/K. Since the linear expansion coefficient of the silicon of the substrate 100 is about $4 \times 10^{-6}$/K, the linear expansion coefficient of the functional layer 133 is as large as 25 times. By performing the heat treatment in a state in which the functional layer 133 is formed on the substrate 100, the deformation of the functional layer 133 is utilized, thereby making it possible to form the insulator portion 135.

Thereafter, the upper electrode 134 is formed. In particular, ITO, IZO, or ZnO or the like is deposited on the functional layer 133 to form the upper electrode 134. Thereafter, the insulating layer 136, the color filter layer 137, the planarizing layer 138, and a microlens layer 139 are sequentially formed. A method of manufacturing a general semiconductor apparatus can be applied to the method of manufacturing these. As described above, it is possible to produce a semiconductor apparatus shown in FIG. 1.

According to the present embodiment as described above, in a state where a voltage is applied between the upper electrode 134 and the lower electrode 131, it is possible to alleviate the electric field extending to the adjacent unit cell 120. Furthermore, according to the present embodiment, it is possible to selectively and effectively collect only the carriers generated on the lower electrode 131. Furthermore, by having a configuration for removing a portion of the interface layer 132 between the adjacent lower electrodes 131, it is possible to reduce the crosstalk due to the carriers generated by the adjacent unit cells 120. By having the insulator portion 135 in a portion of the functional layer 133 between the adjacent lower electrodes 131, it is possible to reduce the crosstalk due to the carriers generated in the adjacent unit cells 120. Thus, according to the semiconductor apparatus of the present embodiment, it is possible to reduce the crosstalk. Furthermore, in a case where the difference in the refractive index between the functional layer 133 and the insulator portion 135 is large, since it is possible to reflect the light reaching the side surface of the insulator portion 135 by the insulator portion 135, and to condense the resultant light on the lower electrode 131, it is possible to improve the sensitivity.

Second Embodiment

Figure 3A:
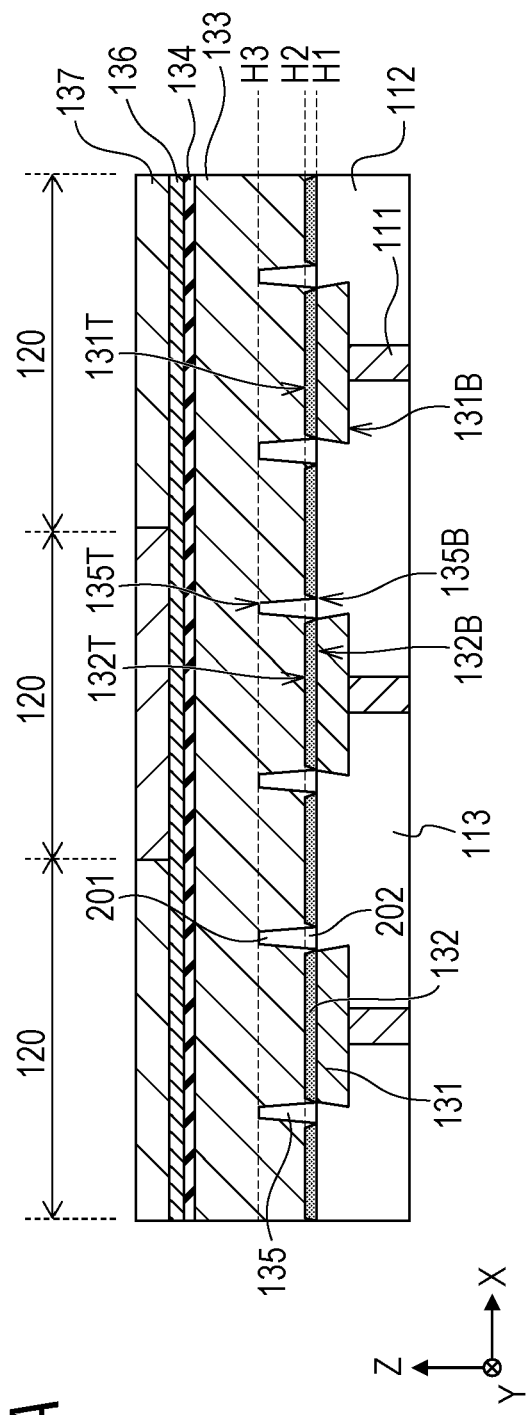
FIG. 3A is a schematic cross-sectional view showing a semiconductor apparatus in the second embodiment.

A schematic cross-sectional view of a semiconductor apparatus of the present embodiment is shown in FIG. 3A. FIG. 3A is a schematic cross-sectional view corresponding to FIG. 2A. Parts not shown in FIG. 3A of the semiconductor apparatus of the present embodiment are assumed to have the same configuration as in FIG. 1. Hereinafter, a description will be given by focusing on the difference from the first embodiment.

The configuration of FIG. 3A differs from the configuration of FIG. 2A in that the widths of the insulator portion 135 are different from each other, and two insulator portions 135 are arranged between two lower electrodes 131. Furthermore, in FIG. 3A, it can also be recognized that the two insulator portions 135 are provided with respect to one lower electrode 131. More specifically, each one insulator portion 135 is disposed at both ends of one lower electrode 131. Even with such a configuration, as in FIG. 2A, it is possible to reduce the crosstalk between adjacent unit cells 120.

Figure 3B:
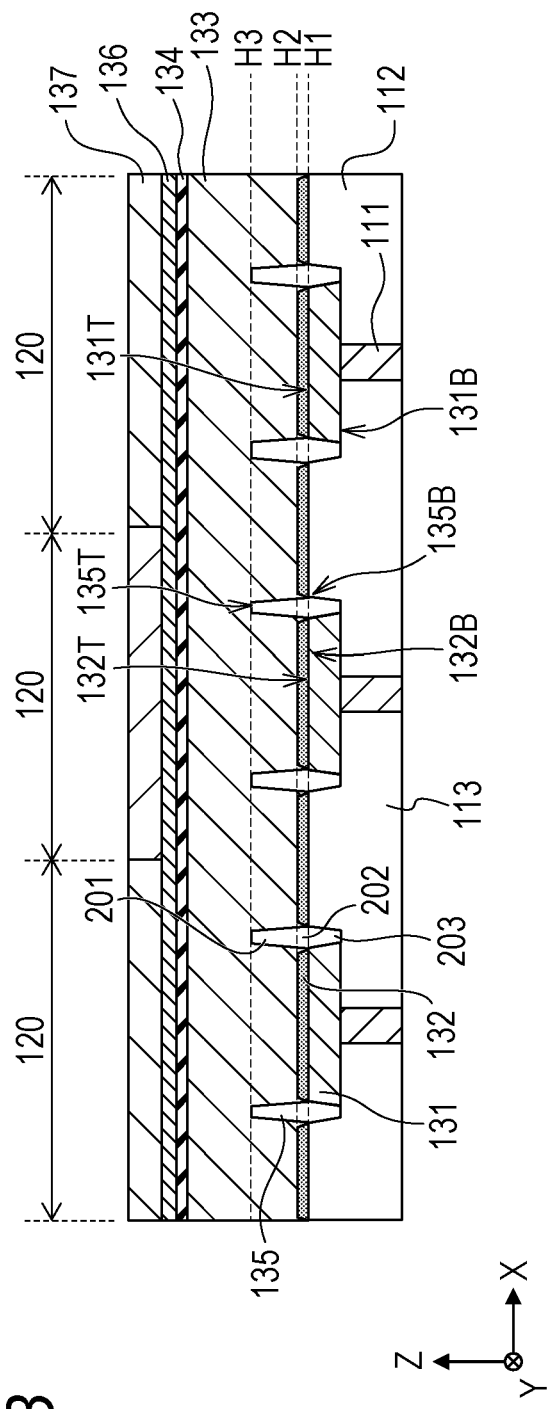
FIG. 3B is a schematic cross-sectional view showing a modification example of the semiconductor apparatus in the second embodiment.

Furthermore, a modification example of the present embodiment is shown in FIG. 3B. This modification example differs in that, in the configuration of FIG. 3A, the insulator portion 135 has a portion 203 as shown in FIG. 2B. Even with such a configuration, it is possible to reduce the crosstalk between adjacent unit cells 120, as in FIG. 2B.

Third Embodiment

Figure 4A:
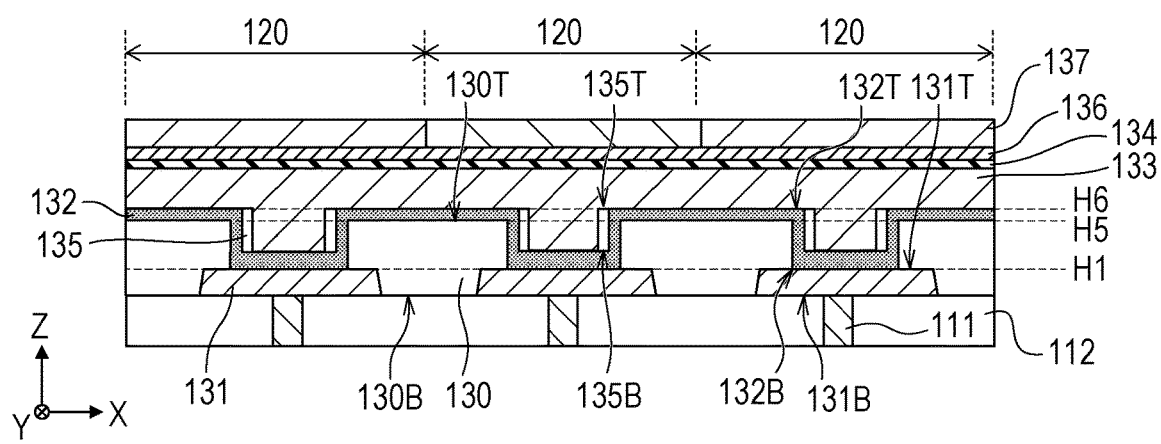
FIG. 4A is a schematic cross-sectional view showing a semiconductor apparatus in the third embodiment.

A schematic cross-sectional view of a semiconductor apparatus of the present embodiment is shown in FIG. 4A. FIG. 4A is a schematic cross-sectional view corresponding to FIG. 2A. Parts not shown in FIG. 4A of the semiconductor apparatus of the present embodiment are assumed to have the configuration described in FIG. 1 in the same manner as in FIG. 2A. In the present embodiment, the structure of the isolation region 130 is different from that of the first embodiment. More specifically, the isolation region 130 of the present embodiment is disposed on a portion of the lower electrode 131 as well as between the two lower electrodes 131. An upper surface 130T of the isolation region 130 is provided at a position farther away from the main surface P1 than the upper surface 131T of the lower electrode 131. In FIG. 4A, the upper surface 131T of the lower electrode 131 is located at the height H1, the upper surface 132T of the interface layer 132 is located at the height H6, and the upper surface 135T of the insulator portion 135 is located at the height H6. The upper surface 130T of the isolation region 130 is located at the height H5 located between the heights H1 and H6. In other words, irregularities are configured on the upper surface by the lower electrode 131 and the isolation region 130.

The interface layer 132 is provided along a surface on which the irregularities are configured by the lower electrode 131 and the isolation region 130. It can be recognized that the interface layer 132 is a film of uniform thickness, a film which follows the shape of the base, a conformal film, and the like. Since there are irregularities of the upper surface 132T of the interface layer 132, the adhesion between the functional layer 133 and the interface layer 132 is improved owing to the anchoring effect. Furthermore, since it is possible to increase the thickness of the functional layer 133 located on the lower electrode 131, it is possible to improve the sensitivity.

The insulator portion 135 has a portion 201 disposed between the two lower electrodes 131 and located above the upper surface 132T of the interface layer 132 disposed on the lower electrode 131. Even with the structure of FIG. 4A, it is possible to reduce the crosstalk in the same manner as in the first embodiment.

The insulator portion 135 is provided on the lower electrode 131. The interface layer 132 is disposed between the insulator portion 135 and the lower electrode 131. Since the insulator portion 135 is disposed on the interface layer 132 which is disposed on the lower electrode 131, it is possible to reduce the spread of the electric field and reduce the crosstalk.

Figure 7B:
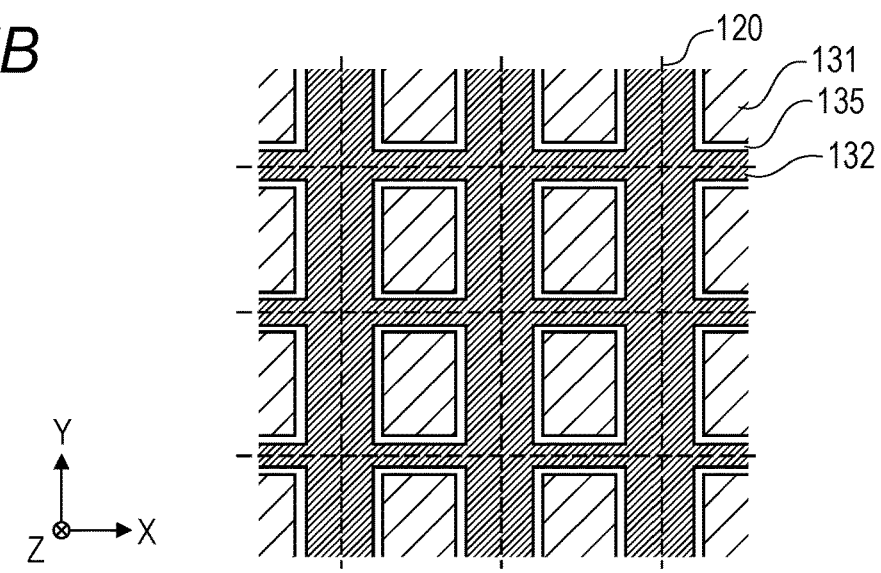
FIG. 7B is a schematic plan view showing a semiconductor apparatus in the third embodiment.

In the configuration of FIG. 4A, a description will be given of the positional relationship of each member. The upper surface 131T of the lower electrode 131 is located at the height H1, and the upper surface 130T of the isolation region 130 and the lower surface 132B of the interface layer 132 are located at the height H5. The upper surface 135T of the insulator portion 135 and the upper surface 132T of the interface layer 132 are located at the height H6. The height H5 is located between the height H6 and the height H1. The lower electrode 131, the insulator portion 135, and the interface layer 132 of FIG. 4A are shown in a planar layout as shown in FIG. 7B. The insulator portion 135 surrounds the lower electrode 131, and the interface layer 132 is in a lattice shape. It should be noted that the insulator portion 135 is shown as one region surrounding the lower electrode 131, and has a continuous shape; however, the insulator portion 135 may be partially cut, and thus may be intermittently present.

Figure 4B:
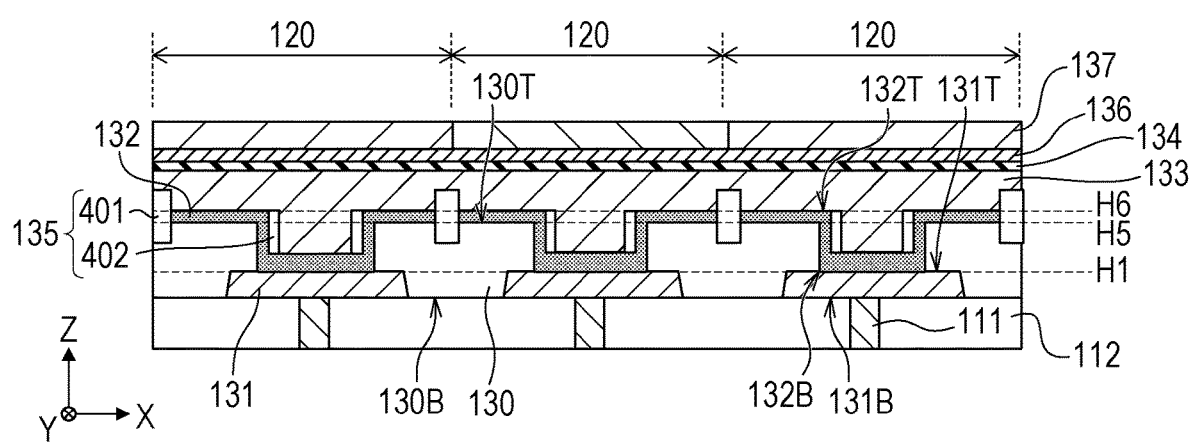
FIG. 4B is a schematic cross-sectional view showing a modification example of the semiconductor apparatus in the third embodiment.
Figure 7C:
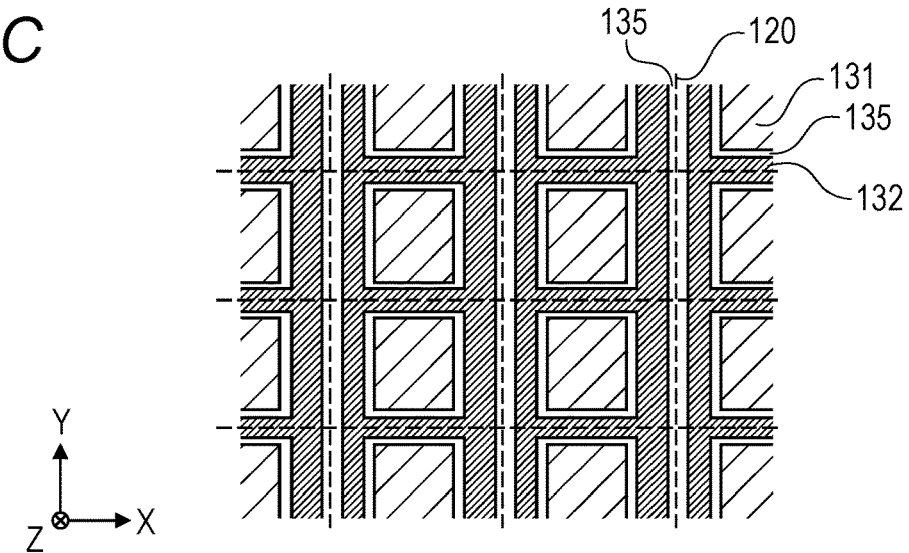
FIG. 7C is a schematic plan view showing a modification example of the semiconductor apparatus in the third embodiment.

Next, a description will be given of a modification example of the present embodiment with reference to FIG. 4B. The insulator portion 135 of FIG. 4B includes both a portion 401, and a portion 402 corresponding to the insulator portion 135 shown in FIG. 4A. The portion 401 is located between the two lower electrodes 131, located closer to the main surface P1 than the lower surface 132B of the interface layer 132 located in the isolation region 130, and located farther away from the main surface P1 than the upper surface 132T of the interface layer 132 located in the isolation region 130. Even with such a configuration, it is possible to reduce the crosstalk. That is, the configuration having at least one of the portion 401 and the portion 402 makes it possible to reduce the crosstalk. It should be noted that the lower electrode 131, the insulator portion 135, and the interface layer 132 of FIG. 4B are shown in a planar layout as shown in FIG. 7C. The insulator portion 135 which is the portion 402 surrounds the lower electrode 131, the insulator portion 135 which is the portion 401 extends over the plurality of unit cells 120 in the Y direction, and the interface layer 132 is in a ladder-like shape. It should be noted that a portion of the insulator portion 135 is shown as one region along the Y direction, and has a continuous shape; however, the insulator portion 135 may be partially cut, and may be intermittently present. Furthermore, a portion of the insulator portion 135 is shown as one region surrounding the lower electrode 131, and has a continuous shape; however, the insulator portion 135 may be partially cut, and may be intermittently present.

Fourth Embodiment

Figure 5A:
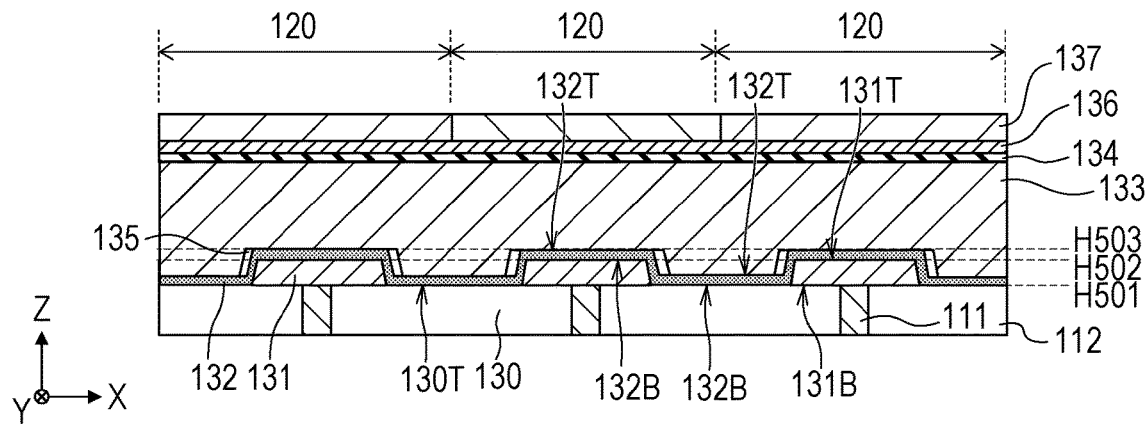
FIG. 5A is a schematic cross-sectional view showing a semiconductor apparatus in the fourth embodiment.

A schematic cross-sectional view of a semiconductor apparatus of the present embodiment is shown in FIG. 5A. FIG. 5A is a schematic cross-sectional view corresponding to FIG. 4A. Parts not shown in FIG. 5A of the semiconductor apparatus of the present embodiment are assumed to have the configuration described in FIG. 1 in the same manner as FIG. 4A. The present embodiment configures a surface having irregularities in the isolation region 130 and the lower electrode 131 in the same manner as in the fourth embodiment; however, the present embodiment differs from the fourth embodiment which configures the convex portion in the isolation region 130 in that the lower electrode 131 configures the convex portion. More specifically, the upper surface 130T of the isolation region 130 and the lower surface 131B of the lower electrode 131 are located at the height H501, and the upper surface 131T of the lower electrode 131 is located at the height H502. With regard to the lower surface 132B of the interface layer 132, a portion disposed on the isolation region 130 is located at the height H501, and a portion disposed on the lower electrode 131 is located at the height H502. The upper surface 132T of the interface layer 132 disposed over the lower electrode 131 is located at the height H503.

The insulator portion 135 is above the isolation region 130, and is disposed on the side surface of the lower electrode 131. The interface layer 132 is located between the insulator portion 135 and the lower electrode 131. That is, the insulator portion 135 is disposed along the side surface of the lower electrode 131, and is, more particularly, disposed along the interface layer 132 along the side surface of the lower electrode 131. The insulator portion 135 has a longitudinal shape in a direction along the side surface of the lower electrode 131, for example, in the Z direction. Since the insulator portion 135 makes it possible to reduce the electric field extending from the side surface of the lower electrode 131 to the adjacent unit cell 120 occurring through the interface layer 132, it is possible to reduce the crosstalk. Furthermore, even if there is a defect in the interface layer 132 on the side surface of the lower electrode 131, by covering the side surface of the interface layer 132 with the insulator portion 135, it is possible to reduce the leakage from the lower electrode 131 to the functional layer 133. In the present embodiment, the width of the insulator portion 135 is about 10 nm to 1 μm, and the height of the insulator portion 135 is about 10 nm to 1 μm.

Figure 9A:
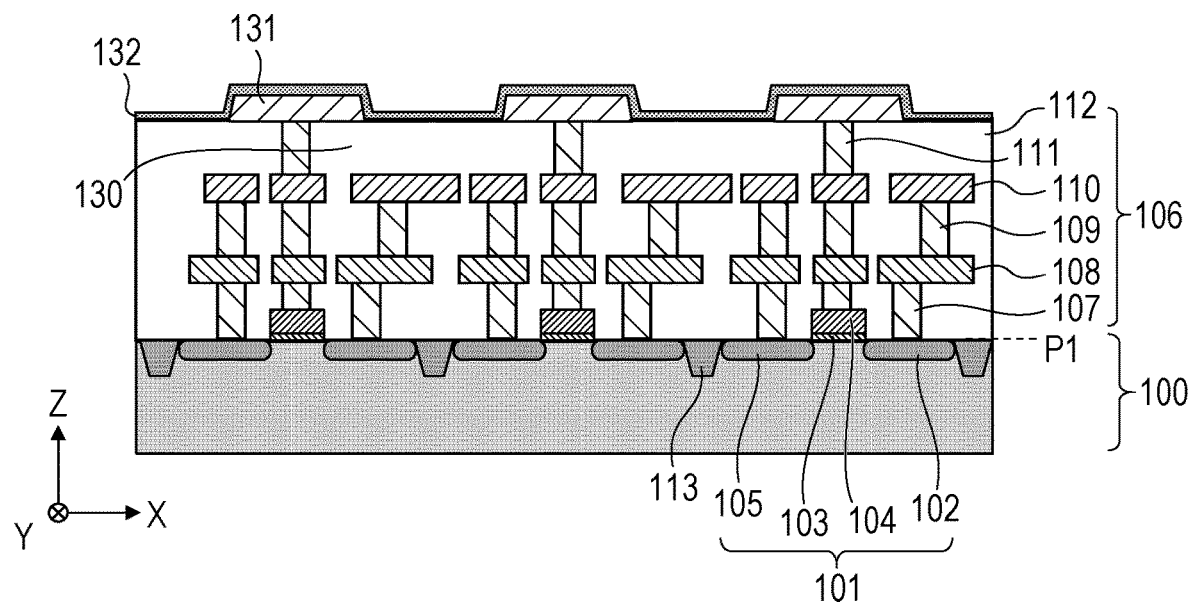
FIG. 9A-9B is a schematic cross-sectional view showing a method of manufacturing a semiconductor apparatus in the fourth embodiment.
Figure 9B:
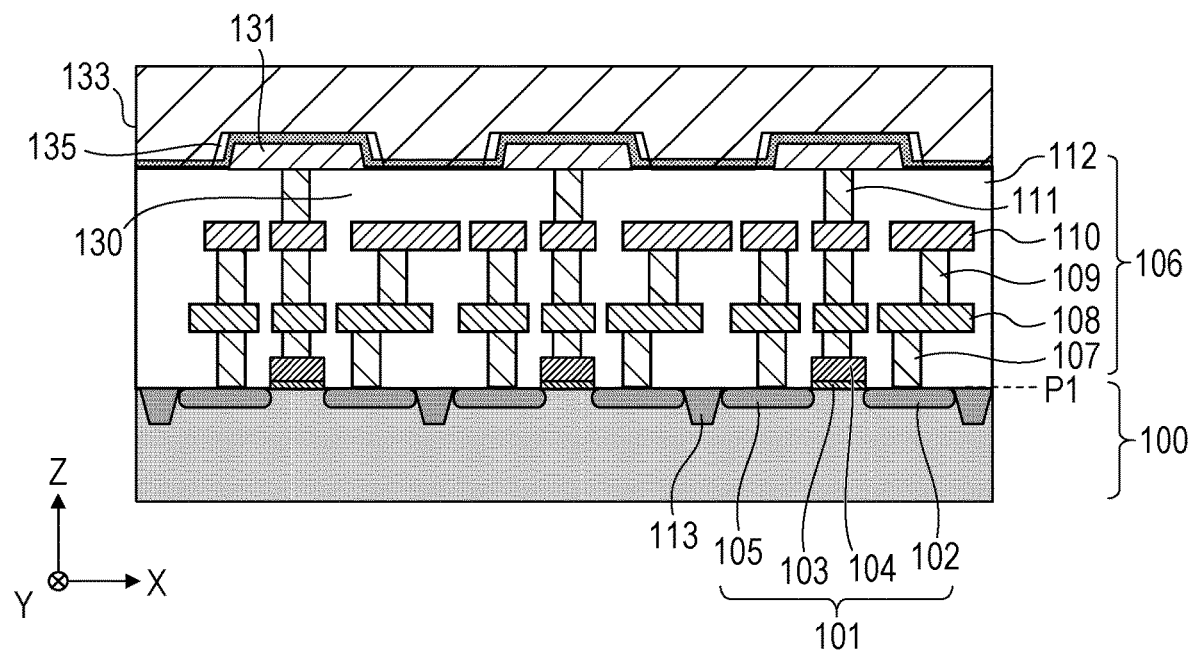

FIGS. 9A and 9B are each a schematic cross-sectional view showing a method of manufacturing a semiconductor apparatus of the present embodiment. In the following description, the same processing as the manufacturing method described in the first embodiment will be omitted.

First, in the step shown in FIG. 9A, the wiring structure 106 is formed on the substrate 100 on which an element such as a transistor is formed. Thereafter, the lower electrode 131 is formed on the upper surface of the insulating film 112. The interface layer 132 with a uniform film thickness is formed by covering the irregularity portion composed of the isolation region 130 and the lower electrode 131. It suffices that the thickness of the lower electrode 131 is 10 nm or more and 10 μm or less. Here, by forming the lower electrode 131 having the thickness of 10 nm or more and 500 nm or less, the irregularities are reduced, and the formation of the interface layer 132 is facilitated. In the present embodiment, it is selected in the range of 100 nm or more and 500 nm or less.

Next, as shown in FIG. 9B, the functional layer 133 is formed on the interface layer 132. The functional layer 133 is formed above the lower electrode 131 and above the isolation region 130. The insulator portion 135 may be formed on the side surface of the lower electrode 131, and at a position through the interface layer 132. For the formation of the insulator portion 135, the characteristics in that the interface layer 132 is hardly formed on the side surface of the lower electrode 131 may be utilized. Furthermore, a method of forming by heat treatment may be used. In the structure having the irregularity portion of the present embodiment, the film of the functional layer 133 disposed on a portion other than the lower electrode 131 serving as a concave portion becomes thicker than the film of the functional layer 133 disposed on the lower electrode 131 of the convex portion. In such a structure in which the film thickness of the functional layer 133 varies, the amount of deformation due to thermal expansion and thermal contraction of the functional layer 133 is large, and therefore, it is easy to form the insulator portion 135. Furthermore, it is possible to adjust the size of the insulator portion 135 on the basis of the amount of deformation during heating of the functional layer 133 and the height of the lower electrode 131. By setting the conditions of the heat treatment so that the amount of deformation during heating of the functional layer 133 is reduced, it is possible to reduce the width of the insulator portion 135. Furthermore, by setting the conditions of the heat treatment so that the amount of deformation during heating of the functional layer 133 is increased, it is possible to increase the width of the insulator portion 135.

Furthermore, the amount of deformation during heating of the functional layer 133 also depends on the film thickness of the functional layer 133. It is possible to reduce the width of the insulator portion 135 by reducing the film thickness of the functional layer 133, and it is possible to increase the width of the insulator portion 135 by increasing the film thickness of the functional layer 133. In other words, it is possible to appropriately set the width of the insulator portion 135 by the film thickness or the configuration of the lower electrode 131 or the isolation region 130. Furthermore, the height of the insulator portion 135 depends on the length of the side surface of the lower electrode 131, and it is possible to lower the height of the insulator portion 135 by lowering the height of the lower electrode 131. In a case where the lower electrode 131 is high, the height of the insulator portion 135 is also increased.

It should be noted that the insulator portion 135 may be formed by other methods as described in the first embodiment. Thereafter, by performing the manufacturing method described in the first embodiment, it is possible to form a semiconductor apparatus of the present embodiment.

Figure 5B:
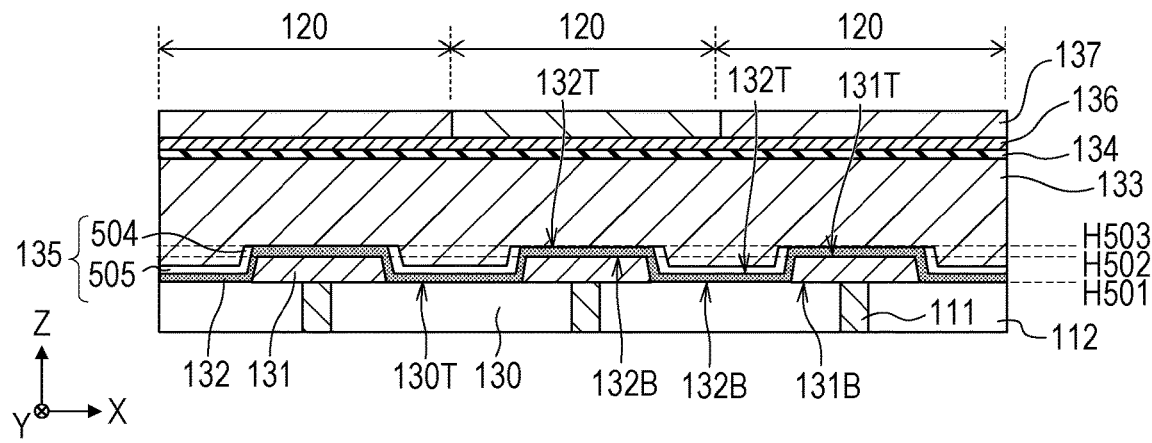
FIG. 5B is a schematic cross-sectional view showing a modification example of the semiconductor apparatus in the fourth embodiment.

Next, a description will be given of a modification example of the semiconductor apparatus of the present embodiment. FIG. 5B is a schematic cross-sectional view showing a modification example of the semiconductor apparatus of the present embodiment. FIG. 5B is a schematic cross-sectional view corresponding to FIG. 5A. Parts not shown in FIG. 5B of the semiconductor apparatus of the present embodiment are assumed to have the configuration described in FIG. 1 in the same manner as FIG. 5A. The insulator portion 135 of FIG. 5B includes a portion 504 corresponding to the insulator portion 135 shown in FIG. 5A and a portion 505 having a longitudinal shape along the X direction between the two portions 504. The portion 505 is disposed between the functional layer 133 and the interface layer 132 on the isolation region 130 between the two lower electrodes 131. Furthermore, the portion 505 is configured to be integral in succession with the portion 504 of a unit cell and the portion 504 of an adjacent unit cell. It is possible to reduce leakage from the functional layer 133 to the wiring structure 106 by including the portion 505. Furthermore, by setting the portion 505 having a refractive index lower than that of the functional layer 133, leakage light that is not absorbed by the functional layer 133 is reflected at the interface between the portion 505 and the functional layer 133, and thus, it is possible to suppress malfunction or noise due to light contamination from the wiring structure 106 to the substrate 100. Furthermore, the insulator portion 135 makes it possible to absorb the thermal deformation of the functional layer 133 in the temperature change of the use environment, it is also possible to improve the reliability.

Figure 5C:
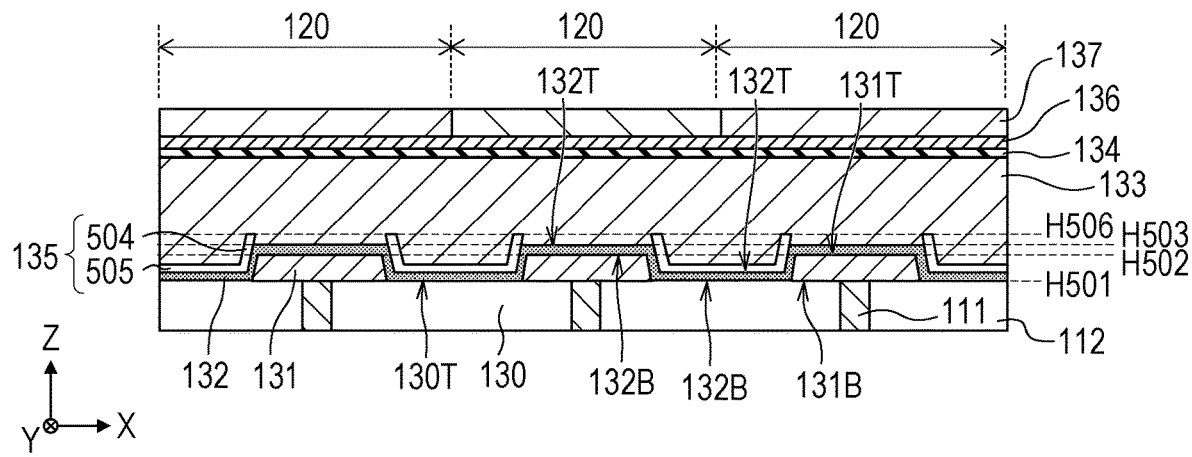
FIG. 5C is a schematic cross-sectional view showing a modification example of the semiconductor apparatus in the fourth embodiment.

Next, a description will be given of a modification example of a semiconductor apparatus of the present embodiment. FIG. 5C is a schematic cross-sectional view showing a modification example of the semiconductor apparatus of the present embodiment. FIG. 5C is a schematic cross-sectional view corresponding to FIG. 5B. Parts not shown in FIG. 5C of the semiconductor apparatus of the present embodiment are assumed to have the configuration described in FIG. 1 in the same manner as FIG. 5B. Here, the portion 504 of the insulator portion 135 of FIG. 5C is located at the height H506 at which the upper surface 504T thereof is positioned above the height H503. That is, the portion 504 is disposed at a position farther away from the main surface P1 than the upper surface 132T of the interface layer 132 located on the lower electrode 131. Such a configuration allows for the separation up to the functional layer 133, and thus, it is possible to further reduce the crosstalk. In FIG. 5C, the insulator portion 135 includes the portion 505; however, it may be a configuration of only the portion 504 as shown in FIG. 5A.

According to the present embodiment, since the lower electrode 131 is a convex portion, the film thickness of the functional layer 133 on the lower electrode 131 is thinner than the film thickness of the functional layer 133 on the isolation region 130. Since the film thickness of the functional layer 133 is reduced, the voltage applied between the lower electrode 131 and the upper electrode 134 is concentrated, and the electric field is increased, only the carriers generated on the lower electrode 131 can be selectively and quickly collected. By placing the insulator portion 135 on the side surface of the lower electrode 131, it is possible to alleviate the electric field strength in the direction of an adjacent unit cell 120. Even when the electrical conductivity of the interface layer 132 or the functional layer 133 is high, it is possible to reduce the crosstalk without collecting the carriers generated in the adjacent unit cells 120. Furthermore, even when, for example, a defect occurs in the interface layer 132 disposed on the side surface of the lower electrode 131, the lower electrode 131 and the functional layer 133 are no longer in a direct contact with each other by the insulator portion 135, the leakage current to the functional layer 133 can be reduced.

Fifth Embodiment

Figure 6A:
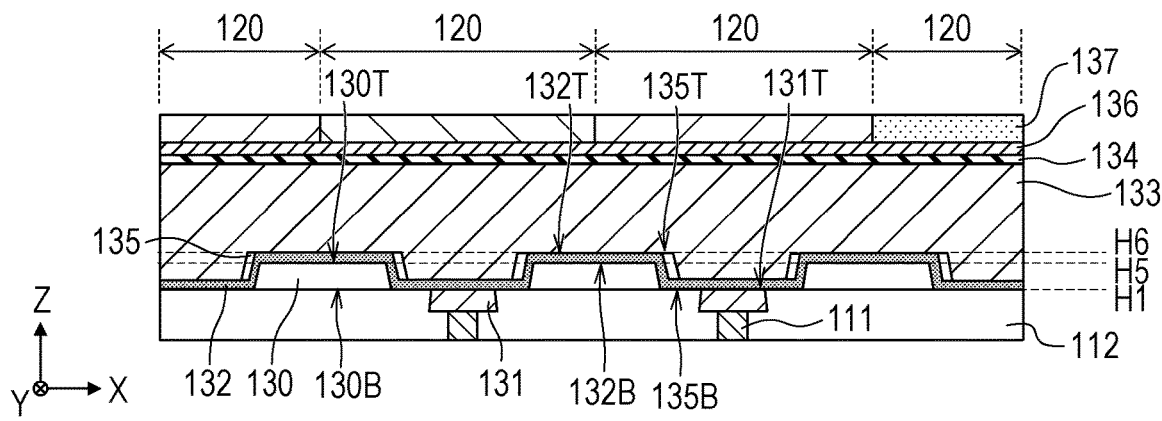
FIG. 6A is a schematic cross-sectional view showing a semiconductor apparatus in the fifth embodiment.

A schematic cross-sectional view of a semiconductor apparatus of the present embodiment is shown in FIG. 6A. FIG. 6A is a schematic cross-sectional view corresponding to FIG. 4A. Parts not shown in FIG. 6A of the semiconductor apparatus of the present embodiment are assumed to have the configuration described in FIG. 1 in the same manner as FIG. 4A. In FIG. 6A, similarly to FIG. 4A, a convex portion is configured in the isolation region 130; however, FIG. 6A differs from FIG. 4A in that the isolation region 130 is not disposed on the lower electrode 131. Such a form still makes it possible to reduce the crosstalk to the adjacent unit cells 120.

Figure 6B:
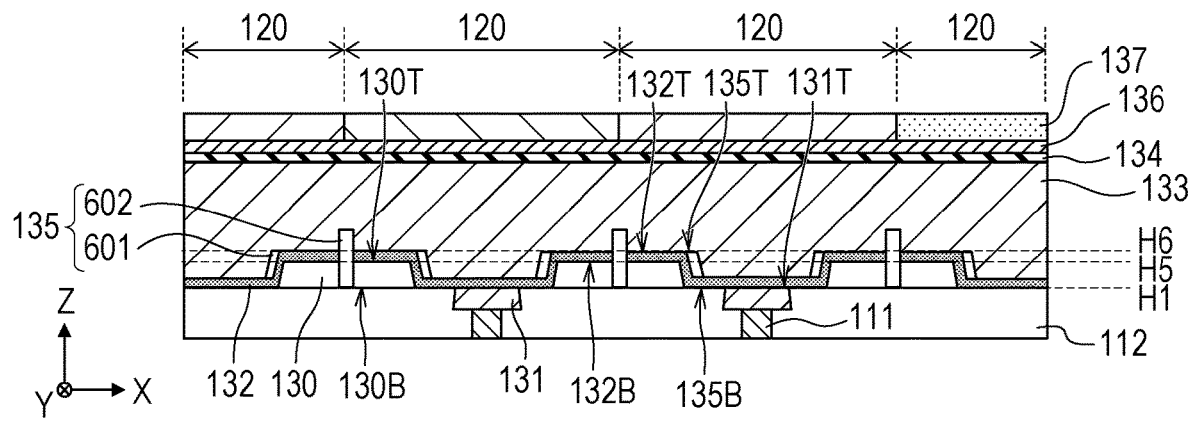
FIG. 6B is a schematic cross-sectional view showing a modification example of the semiconductor apparatus in the fifth embodiment.

A description will be given of a modification example of a semiconductor apparatus of the present embodiment with reference to FIG. 6B. FIG. 6B is a schematic cross-sectional view corresponding to FIG. 6A. Parts not shown in FIG. 6B of the semiconductor apparatus of the present embodiment are assumed to have the configuration described in FIG. 1 in the same manner as FIG. 6A. The insulator portion 135 of FIG. 6B includes a portion 601 corresponding to the insulator portion 135 shown in FIG. 6A and a portion 602 corresponding to the portion 401 shown in FIG. 4C. Even with such a structure, it is still possible to reduce the crosstalk.

Figure 6C:
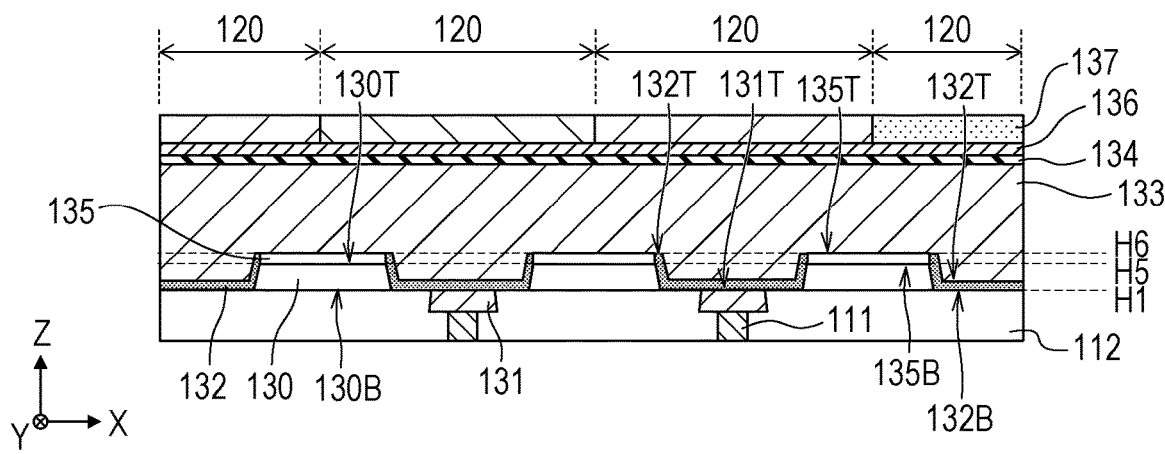
FIG. 6C is a schematic cross-sectional view showing a modification example of the semiconductor apparatus in the fifth embodiment.

A description will be given of a modification example of the semiconductor apparatus of the present embodiment with reference to FIG. 6C. FIG. 6C is a schematic cross-sectional view corresponding to FIG. 6A. Parts not shown in FIG. 6C of the semiconductor apparatus of the present embodiment are assumed to have the configuration described in FIG. 1 in the same manner as FIG. 6A. The insulator portion 135 of FIG. 6C is disposed on the isolation region 130. Since the interface layer 132 is not formed on the upper surface 130T of the isolation region 130 configuring a convex portion, the insulator portion 135 is in contact with the isolation region 130. The insulator portion 135 is disposed above the upper surface of the interface layer 132 disposed on the lower electrode 131. Furthermore, the interface layer 132 is disposed between the insulator portion 135 and the lower electrode 131. Even with such a configuration, it is possible to reduce the crosstalk.

Sixth Embodiment

The semiconductor apparatuses described above can be applied to photodetection systems and light emitting systems. In a case where such a semiconductor apparatus is applied to a photodetection system, the functional layer performs photoelectric conversion. The semiconductor apparatus in this case can also be recognized as a photoelectric conversion apparatus or an image capturing apparatus. In a case where a semiconductor apparatus is applied to a photodetection system, the functional layer performs photoelectric conversion. The semiconductor apparatus in this case can also be recognized as a photoelectric conversion apparatus or an image capturing apparatus. The photodetection system includes a semiconductor apparatus and a signal processing unit for processing signals acquired by the semiconductor apparatus. Furthermore, in a case where such a semiconductor apparatus is applied to a light emitting system, the functional layer emits light by an electrical signal. The semiconductor apparatus in this case can also be recognized as a light emitting device or a display device. The light emitting system includes a semiconductor apparatus, and a control unit for supplying a control signal for causing such a semiconductor apparatus to emit light.

The photodetection systems and the light emitting systems may be, for example, electronic equipment. Such electronic equipment are, for example, cameras, computers, lighting, lighting fixtures, portable terminals, displays, in-vehicle display devices, and the like. In the present embodiment, the image capturing portion of the camera as a photodetection system is shown as a display portion of the camera as a light emitting system.

Referring to FIG. 10, a description will be given of an example of applying a semiconductor apparatus to a camera. The semiconductor apparatus is applied to at least one of an image capturing apparatus 1005 and a display device 1012. A lens unit 1001 is an imaging optical system for imaging the optical image of the object to the image capturing apparatus 1005, and includes a focus lens, a variable magnification lens, an aperture, and the like. The drive of the focus lens position, the variable magnification lens position, the aperture diameter of the aperture, and the like in the lens unit 1001 is controlled by a control unit 1009 through a lens driving unit 1002. A shutter 1003 is a mechanical shutter disposed between the lens unit 1001 and the image capturing apparatus 1005. The drive is controlled by the control unit 1009 through a shutter driving unit 1004. The image capturing apparatus 1005 converts the optical image imaged by the lens unit 1001 by a plurality of pixels into an image signal. A signal processing unit 1006 performs signal processing such as A/D conversion, demosaic processing, white balance adjustment processing, and encoding processing on an image signal output from the image capturing apparatus 1005. The control unit 1009 includes, for example, memory (ROM and RAM) and a microprocessor (CPU), and loads, to the RAM, a program stored in the ROM and executes, by the CPU, the program for controlling each unit, thereby realizing various functions of the camera. The functions realized by the control unit 1009 includes, for example, automatic focus detection (AF) and automatic exposure control (AE).

A memory unit 1008 is used for the control unit 1009 and the signal processing unit 1006 temporarily storing the image data, or used as a work area. A medium I/F unit 1010 is an interface for reading and writing a recording medium 1011 which is, for example, a removable memory card. The display device 1012 displays various pieces of information of the captured images and cameras. The display device 1012 is controlled by the control unit 1009 and displays an image and various pieces of information. An operation unit 1007 is a user interface for instructing and setting the camera by a user, such as a power switch, a release button, and a menu button.

Next, a description will be given of the operation of the camera at the time of shooting. When the camera is turned on, it enters a shooting standby mode. The control unit 1009 starts moving image shooting processing and display processing for operating the display device 1012 as an electronic viewfinder. When a shooting preparation instruction (e.g., pressing the release button of the operation unit 1007 halfway) is input in the shooting standby state, the control unit 1009 starts focus detection processing.

Thereafter, the control unit 1009 obtains the movement amount and the moving direction of the focus lens of the lens unit 1001 from the resulting defocus amount and direction, and drives the focus lens through the lens driving unit 1002, to thereby adjust the focus of the imaging optical system. After driving, the focus lens position may be finely adjusted by further performing focus detection based on the contrast evaluation value as necessary.

Thereafter, when the photographing start instruction (for example, full press of the release button) is input, the control unit 1009 executes the photographing operation for recording, performs processing of the obtained image data by the signal processing unit 1006, and stores the resultant data in the memory unit 1008. Furthermore, the control unit 1009 records the image data stored in the memory unit 1008 in the recording medium 1011 through the medium I/F unit 1010. Furthermore, at this time, the control unit 1009 may drive the display device 1012 so as to display the captured image. Furthermore, the control unit 1009 may output the image data from an external I/F unit (not shown) to an external device such as a computer.

In this manner, the semiconductor apparatus of each embodiment may be mounted on the camera. In the present embodiment, although a camera having both the photodetection system and the light emitting system has been exemplified as an example, the camera may have any one of these systems.

Seventh Embodiment

Figure 11A:
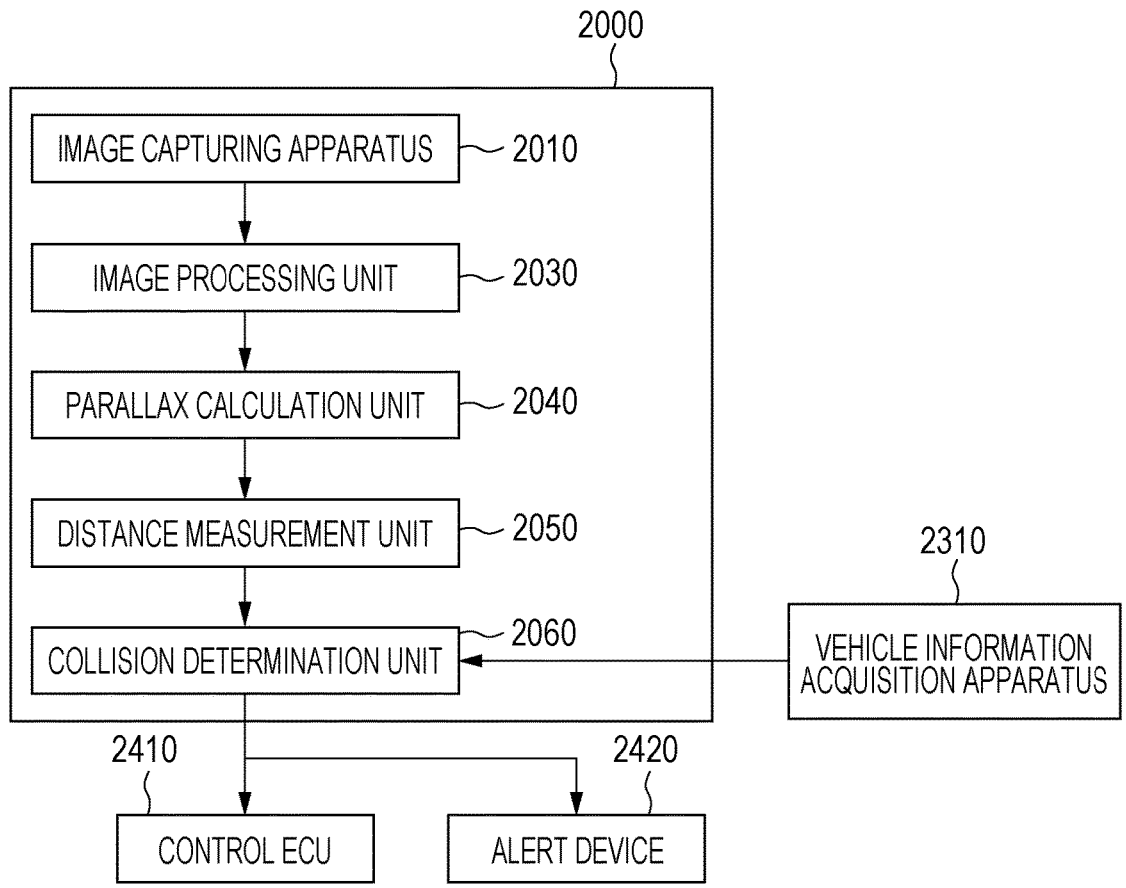
FIG. 11A-11B is a block diagram showing a moving body.
Figure 11B:
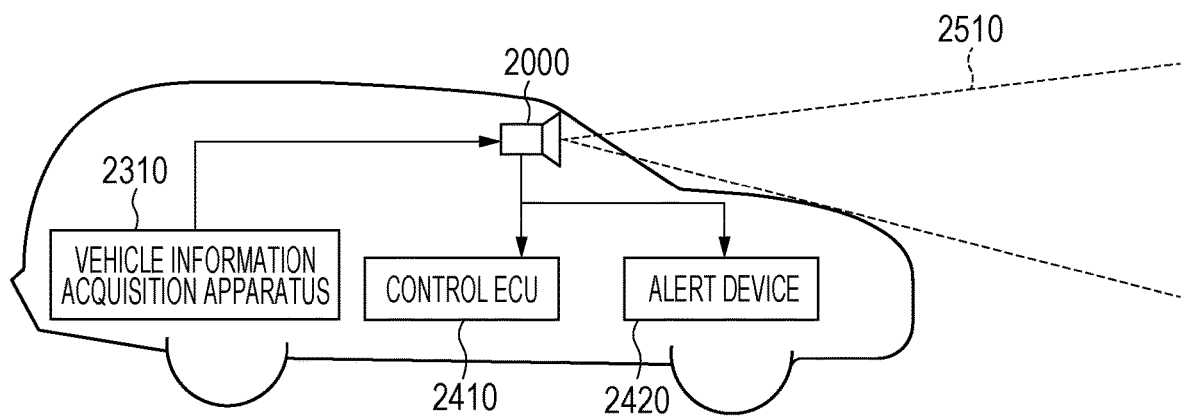

FIGS. 11A and 11B show examples in which the above-described semiconductor apparatus is applied to an image capturing system relating to a car-mounted camera. In the present embodiment, the image capturing apparatus 2010 corresponds to the semiconductor apparatus described above.

The image capturing system 2000 includes an image processing unit 2030 that performs image processing on a plurality of pieces of image data acquired by an image capturing apparatus 2010, and a parallax calculation unit 2040 that calculates a parallax (a phase difference of parallax images) from a plurality of pieces of image data acquired from the image capturing system 2000. Moreover, the image capturing system 2000 includes a distance measurement unit 2050 that calculates a distance to a target object based on the calculated parallax, and a collision determination unit 2060 that determines whether there is a possibility of collision based on the calculated distance. Herein, each of the parallax calculation unit 2040 and the distance measurement unit 2050 is one example of a distance information acquisition unit that acquires distance information up to a target object. That is, the distance information is information about a parallax, a defocus amount, and a distance to a target object. The collision determination unit 2060 can use any of such distance information to determine a collision possibility. The distance information acquisition unit can be realized by hardware designed for and dedicated to acquisition of distance information or realized by a software module. Alternatively, the distance information acquisition unit can be realized by, for example, a field programmable gate array (FPGA), and an application specific integrated circuit (ASIC), or a combination of the FPGA and the ASIC.

The image capturing system 2000 is connected to a vehicle information acquisition apparatus 2310, and thus, the image capturing system 2000 can acquire vehicle information such as vehicle speed, yaw rate, and rudder angle. Moreover, a control ECU 2410 is connected to the image capturing system 2000. The control ECU 2410 as a control device outputs a control signal for generating a braking force with respect to a vehicle based on a determination result determined by the collision determination unit 2060. The image capturing system 2000 is also connected to an alert device 2420 that issues an alert to a driver based on a determination result determined by the collision determination unit 2060. For example, if a collision possibility is high based on a result determined by the collision determination unit 2060, the control ECU 2410 performs vehicle control to prevent a collision or reduce damage by braking the vehicle, releasing an accelerator, or suppressing an engine output. The alert device 2420 issues an alert such as sound, displays alert information on a screen such as a car navigation system, or vibrates a seat belt or a steering wheel to alert the user to a situation. The image capturing system 2000 serves as a control unit for controlling the operation of controlling the vehicle as described above.

In the present embodiment, the periphery of the vehicle such as a front view or a rear view of the vehicle is image-captured by the image capturing system 2000. FIG. 11B shows an image capturing system in a case of image-capturing the front view of the vehicle (an image capturing range 2510). The vehicle information acquisition apparatus 2310 as an image capturing control unit sends an instruction to the image capturing system 2000 or the image capturing apparatus 2010. With such a configuration, it is possible to further improve the accuracy of focusing.

The present exemplary embodiment has been described using an example in which control is performed such that a vehicle does not collide with another vehicle. However, the present exemplary embodiment can also be applied to control of automatic operation by following another vehicle, and control of automatic operation such that a vehicle does not stray off a traffic lane. Moreover, application of the image capturing system is not limited to a vehicle such as an automobile. The image capturing system can be applied to, for example, a vessel, an aircraft, or a moving body (a moving apparatus) such as an industrial robot. In addition, the image capturing system can be applied to not only the moving body, but also equipment that widely uses object recognition. An example of such equipment is an intelligent transportation system (ITS).

Furthermore, the moving body, as a light emitting device by the semiconductor apparatus described above, may have, for example, a lamp device such as a tail lamp or a display device in a vehicle, and a control unit.

In the above embodiment, the substrate of the semiconductor apparatus has been described for the case of a transistor using a single crystal silicon wafer; however, the present disclosure is not limited thereto, and it may be a thin film transistor having an active layer on the insulating surface of the substrate. Examples of the semiconductor substrates include single crystal silicon, amorphous silicon, non-single crystal silicon such as microcrystalline silicon, indium zinc oxide, and non-single crystal oxide semiconductors such as indium gallium zinc oxide. It should be noted that the transistor may be a thin film transistor, and the thin film transistor is also referred to as a TFT element.

It should be noted that each of the above embodiments is only an example of embodiments in carrying out the present disclosure, and the technical scope of the present disclosure should not be limitatively interpreted by these embodiments. The present disclosure can be implemented in a variety of ways without departing from its technical thought, or its major features.

While the present disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of Japanese Patent Application No. 2019-061556, filed Mar. 27, 2019, which is hereby incorporated by reference herein in its entirety.

What is claimed is:
1. A semiconductor apparatus comprising:
   a first unit cell and a second unit cell disposed on a substrate having a main surface,
   the first unit cell and the second unit cell each including,
   an upper electrode disposed above the substrate,
   a first lower electrode disposed between the substrate and the upper electrode,
   a second lower electrode disposed between the substrate and the upper electrode,
   an isolation region disposed between the first lower electrode and the second lower electrode,
   a functional layer disposed between the first lower electrode and the upper electrode and between the second lower electrode and the upper electrode, the functional layer being configured to perform light emission or photoelectric conversion, and an interface layer having a portion disposed between the first lower electrode and the functional layer, and a portion disposed between the second lower electrode and the functional layer, the functional layer of the first unit cell and the functional layer of the second unit cell being disposed in common to the first unit cell and the second unit cell; and a first insulator portion being a cavity disposed between the first lower electrode and the second lower electrode, wherein, viewing along a direction connecting the cavity and the main surface between the first lower electrode and the second lower electrode, a distance between an upper surface of the cavity and the main surface is larger than a distance between an upper surface of the interface layer and the main surface.

2. The semiconductor apparatus according to claim 1, wherein the first insulator portion includes a second portion that is located closer to the main surface than the upper surface of the portion disposed between the first lower electrode of the interface layer and the functional layer.

3. The semiconductor apparatus according to claim 1, wherein the first insulator portion includes a third portion that is located closer to the main surface than an upper surface of the first lower electrode.

4. The semiconductor apparatus according to claim 1, wherein the first insulator portion is in contact with a side surface of the first lower electrode.

5. The semiconductor apparatus according to claim 1, further comprising:
a second insulator portion that is disposed between the first insulator portion and the second lower electrode, and includes a first portion that is located above the upper surface of the portion of the interface layer disposed between the first lower electrode and the functional layer and is surrounded by the functional layer in a plan view along a surface parallel with the main surface.

6. The semiconductor apparatus according to claim 1, wherein an upper surface of the isolation region and an upper surface of the first lower electrode are included in one surface.

7. The semiconductor apparatus according to claim 1, wherein a distance between an upper surface of the isolation region and the main surface is larger than a distance between an upper surface of the first lower electrode and the main surface.

8. The semiconductor apparatus according to claim 1, wherein the cavity has a vacuum, contains air, or contains a portion of a component of the functional layer that is vaporized.

9. The semiconductor apparatus according to claim 1, wherein the interface layer is a carrier injection blocking layer that can control delivery of an electric charge in one direction between the first lower electrode and the functional layer.

10. The semiconductor apparatus according to claim 1, wherein the substrate includes a transistor that is electrically coupled to the first lower electrode.

11. The semiconductor apparatus according to claim 1, wherein the functional layer is a photoelectric conversion layer composed of an organic material.

12. The semiconductor apparatus according to claim 1, wherein the functional layer is a photoelectric conversion layer composed of a quantum dot including an aggregate of a plurality of nanoparticles.

13. The semiconductor apparatus according to claim 12, wherein the aggregate of the plurality of nanoparticles contains any of PbS, PbSe, PbTe, InP, InAs, CdS, CdSe, or CdTe.

14. A photodetection system comprising:
the semiconductor apparatus according to claim 1, the functional layer performing photoelectric conversion; and
a signal processing unit configured to process a signal acquired by the semiconductor apparatus.

15. A moving body comprising:
the semiconductor apparatus according to claim 1, the functional layer performing photoelectric conversion;
a signal processing unit configured to process a signal acquired by the semiconductor apparatus; and
a control device connected to the signal processing unit and configured to output a control signal for the moving body.

16. The semiconductor apparatus according to claim 1, wherein the functional layer is composed of an organic material and is configured to emit light.

17. A light emitting system comprising:
the semiconductor apparatus according to claim 16; and
a control unit configured to supply a control signal for causing the semiconductor apparatus to emit light.

18. The semiconductor apparatus according to claim 1, wherein the isolation region includes an insulating film.

19. A semiconductor apparatus comprising:
a substrate having a main surface;
an upper electrode disposed above the substrate,
a first lower electrode disposed between the substrate and the upper electrode,
a second lower electrode disposed between the substrate and the upper electrode,
an isolation region disposed between the first lower electrode and the second lower electrode,
a functional layer disposed in succession between the first lower electrode and the upper electrode and between the second lower electrode and the upper electrode, the functional layer being configured to perform light emission or photoelectric conversion;
an interface layer disposed at least between an upper surface of the first lower electrode and the functional layer; and
a first insulator portion being a cavity and disposed above the first lower electrode,
wherein the first insulator portion is located between the functional layer and the interface layer is located between the first lower electrode and the first insulator portion.

20. The semiconductor apparatus according to claim 19, wherein a distance between the upper surface of the first lower electrode and the main surface is larger than a distance between an upper surface of the isolation region and the main surface.

21. The semiconductor apparatus according to claim 20, wherein a distance between an upper surface of the interface layer disposed between the upper surface of the first lower electrode and the functional layer is larger than a distance between an upper surface of the first insulator portion and the main surface.

22. The semiconductor apparatus according to claim 20, wherein a distance between an upper surface of the second lower electrode and the main surface is larger than a distance between the upper surface of the isolation region and the main surface, and wherein the interface layer is disposed in succession from the upper surface of the first lower electrode to a side surface of the first lower electrode, to the upper surface of the isolation region, to a side surface of the second lower electrode, and to the upper surface of the second lower electrode, and the first insulator portion is in contact with the interface layer, and is disposed along the side surface of the first lower electrode, the side surface of the second lower electrode, and the upper surface of the isolation region.

23. The semiconductor apparatus according to claim 19, wherein a distance between the upper surface of the first lower electrode and the main surface is smaller than a distance between an upper surface of the isolation region and the main surface.

24. The semiconductor apparatus according to claim 23, wherein the interface layer is disposed between the upper surface of the isolation region and the functional layer, and
wherein a distance between an upper surface of the interface layer disposed in the isolation region and the main surface is larger than a distance between an upper surface of the first insulator portion and the main surface.

25. The semiconductor apparatus according to claim 19, wherein a portion of the isolation region is located on a portion of the first lower electrode,
the first insulator portion is located on the portion of the first lower electrode, and
the interface layer is disposed between the first insulator portion and the upper surface of the first lower electrode and between the first insulator portion and a portion of the isolation region.

26. The semiconductor apparatus according to claim 19, wherein the interface layer is a carrier injection blocking layer that can control delivery of an electric charge in one direction between the first lower electrode and the functional layer.

27. The semiconductor apparatus according to claim 19, wherein the substrate includes a transistor that is electrically coupled to the first lower electrode.

28. The semiconductor apparatus according to claim 19, wherein the functional layer is a photoelectric conversion layer composed of an organic material.

29. The semiconductor apparatus according to claim 19, wherein the functional layer is a photoelectric conversion layer composed of a quantum dot including an aggregate of a plurality of nanoparticles.

30. The semiconductor apparatus according to claim 29, wherein the aggregate of the plurality of nanoparticles contains any of PbS, PbSe, PbTe, InP, InAs, CdS, CdSe, or CdTe.

31. A photodetection system comprising:
the semiconductor apparatus according to claim 19, the functional layer performing photoelectric conversion; and
a signal processing unit configured to process a signal acquired by the semiconductor apparatus.

32. A moving body comprising:
the semiconductor apparatus according to claim 19
the functional layer performing photoelectric conversion;
a signal processing unit configured to process a signal acquired by the semiconductor apparatus; and
a control device connected to the signal processing unit and configured to output a control signal for the moving body.

33. The semiconductor apparatus according to claim 19, wherein the functional layer is composed of an organic material and is configured to emit light.

34. A light emitting system comprising:
the semiconductor apparatus according to claim 33; and
a control unit configured to supply a control signal for causing the semiconductor apparatus to emit light.

35. The semiconductor apparatus according to claim 19, wherein the cavity has a vacuum, contains air, or contains a portion of a component of the function layer that is vaporized.

36. The semiconductor apparatus according to claim 19, wherein the isolation region includes an insulating film.

37. A semiconductor apparatus comprising:
a substrate having a main surface;
an upper electrode disposed above the substrate,
a first lower electrode disposed between the substrate and the upper electrode,
a second lower electrode disposed between the substrate and the upper electrode,
an isolation region disposed between the first lower electrode and the second lower electrode,
a functional layer disposed in succession between the first lower electrode and the upper electrode and between the second lower electrode and the upper electrode, the functional layer being configured to perform light emission or photoelectric conversion;
an interface layer disposed at least between an upper surface of the first lower electrode and the functional layer; and
a first insulator portion,
wherein the interface layer is located between the first lower electrode and the first insulator portion,
wherein a portion of the isolation region is located on a portion of the first lower electrode,
the first insulator portion is located on the portion of the first lower electrode, and
the interface layer is disposed between the first insulator portion and the upper surface of the first lower electrode and between the first insulator portion and a portion of the isolation region.

38. The semiconductor apparatus according to claim 37, wherein the interface layer is a carrier injection blocking layer that can control delivery of an electric charge in one direction between the first lower electrode and the functional layer.

39. The semiconductor apparatus according to claim 37, wherein the substrate includes a transistor that is electrically coupled to the first lower electrode.

40. The semiconductor apparatus according to claim 37, wherein the functional layer is a photoelectric conversion layer composed of an organic material.

41. The semiconductor apparatus according to claim 37, wherein the functional layer is a photoelectric conversion layer composed of a quantum dot including an aggregate of a plurality of nanoparticles.

42. The semiconductor apparatus according to claim 41, wherein the aggregate of the plurality of nanoparticles contains any of PbS, PbSe, PbTe, InP, InAs, CdS, CdSe, or CdTe.

43. A photodetection system comprising:
the semiconductor apparatus according to claim 37,
the functional layer performing photoelectric conversion; and
a signal processing unit configured to process a signal acquired by the semiconductor apparatus.

44. A moving body comprising:
the semiconductor apparatus according to claim 37,
the functional layer performing photoelectric conversion;
a signal processing unit configured to process a signal acquired by the semiconductor apparatus; and
a control device connected to the signal processing unit and configured to output a control signal for the moving body.

45. The semiconductor apparatus according to claim 37, wherein the functional layer is composed of an organic material and is configured to emit light.

46. A light emitting system comprising:
the semiconductor apparatus according to claim 45; and
a control unit configured to supply a control signal for causing the semiconductor apparatus to emit light.

47. A moving body comprising:
the semiconductor apparatus according to claim 45; and
a control unit configured to supply a control signal for causing the semiconductor apparatus to emit light.

48. The semiconductor apparatus according to claim 45, wherein the cavity has a vacuum, contains air, or contains a portion of a component of the function layer that is vaporized.

49. The semiconductor apparatus according to claim 45, wherein the isolation region includes an insulating film.

* * * * *